(12) United States Patent
Kurihara et al.

(10) Patent No.: US 7,002,803 B2
(45) Date of Patent: Feb. 21, 2006

(54) ELECTRONIC PRODUCT WITH HEAT RADIATING PLATE

(75) Inventors: Toshimichi Kurihara, Kawasaki (JP); Takashi Ueda, Ohtsu (JP)

(73) Assignee: NEC Compound Semiconductor Devices, Ltd., (JP)

( * ) Notice: Subject to any disclaimer, the term of this patent is extended or adjusted under 35 U.S.C. 154(b) by 181 days.

(21) Appl. No.: 10/374,602

(22) Filed: Feb. 25, 2003

(65) Prior Publication Data

US 2003/0161109 A1    Aug. 28, 2003

(30) Foreign Application Priority Data

Feb. 27, 2002   (JP)   ............... 2002-052295

(51) Int. Cl.
*H05K 7/20* (2006.01)
(52) U.S. Cl. .................. 361/704; 165/185; 257/678; 257/690; 257/693; 361/707; 361/717
(58) Field of Classification Search ...... 165/80.2–80.3, 165/185; 174/16.3; 361/704–710, 714, 361/717–718, 722; 257/706–707, 712–713, 257/704, 679, 690–697, 787–788, 796
See application file for complete search history.

(56) References Cited

U.S. PATENT DOCUMENTS

| 3,767,839 | A |   | 10/1973 | Beal .............................. 174/52 |
| 4,139,859 | A |   | 2/1979 | Lewis et al. ................... 357/72 |
| 4,458,291 | A | * | 7/1984 | Yanagisawa et al. ........ 361/212 |
| 4,876,588 | A | * | 10/1989 | Miyamoto ................... 257/706 |
| 5,012,386 | A | * | 4/1991 | McShane et al. ............ 361/715 |
| 5,041,902 | A | * | 8/1991 | McShane ..................... 257/706 |
| 5,103,292 | A |   | 4/1992 | Mahulikar ................... 357/74 |
| 5,315,153 | A |   | 5/1994 | Nagai et al. ................. 257/701 |
| 5,657,203 | A | * | 8/1997 | Hirao et al. ................. 361/707 |
| 5,801,435 | A | * | 9/1998 | Otsuki ......................... 257/675 |
| 5,814,883 | A |   | 9/1998 | Sawai et al. ................. 257/712 |
| 5,869,883 | A |   | 2/1999 | Mehringer et al. ......... 257/667 |

FOREIGN PATENT DOCUMENTS

| EP | 0658935 | 12/1994 |
| EP | 0928026 | 7/1999 |
| EP | 1187197 | 3/2002 |
| JP | 50-133860 | 4/1949 |
| JP | 60-007741 | 1/1985 |
| JP | 11-176966 | 7/1999 |
| JP | 2001-094006 | 4/2001 |
| JP | 2002-076158 | 3/2002 |

* cited by examiner

*Primary Examiner*—Gregory Thompson
(74) *Attorney, Agent, or Firm*—Hayes Soloway P.C.

(57) ABSTRACT

An electronic product comprises a heat radiating plate, an electronic component securely mounted on the heat radiating plate and including a high power transistor, an enveloper including a frame member securely associated with the heat radiating plate to encompass the electronic component, and a lid member securely attached to an upper opening end of the frame member, thereby accommodating and sealing the electronic component in the enveloper, and at least one electrically conductive element passing and extending through the frame member. The frame member is made of a suitable resin material, and the lid member is made of one material selected from the group consisting of a ceramic material, a metal material, and a composite material.

42 Claims, 20 Drawing Sheets

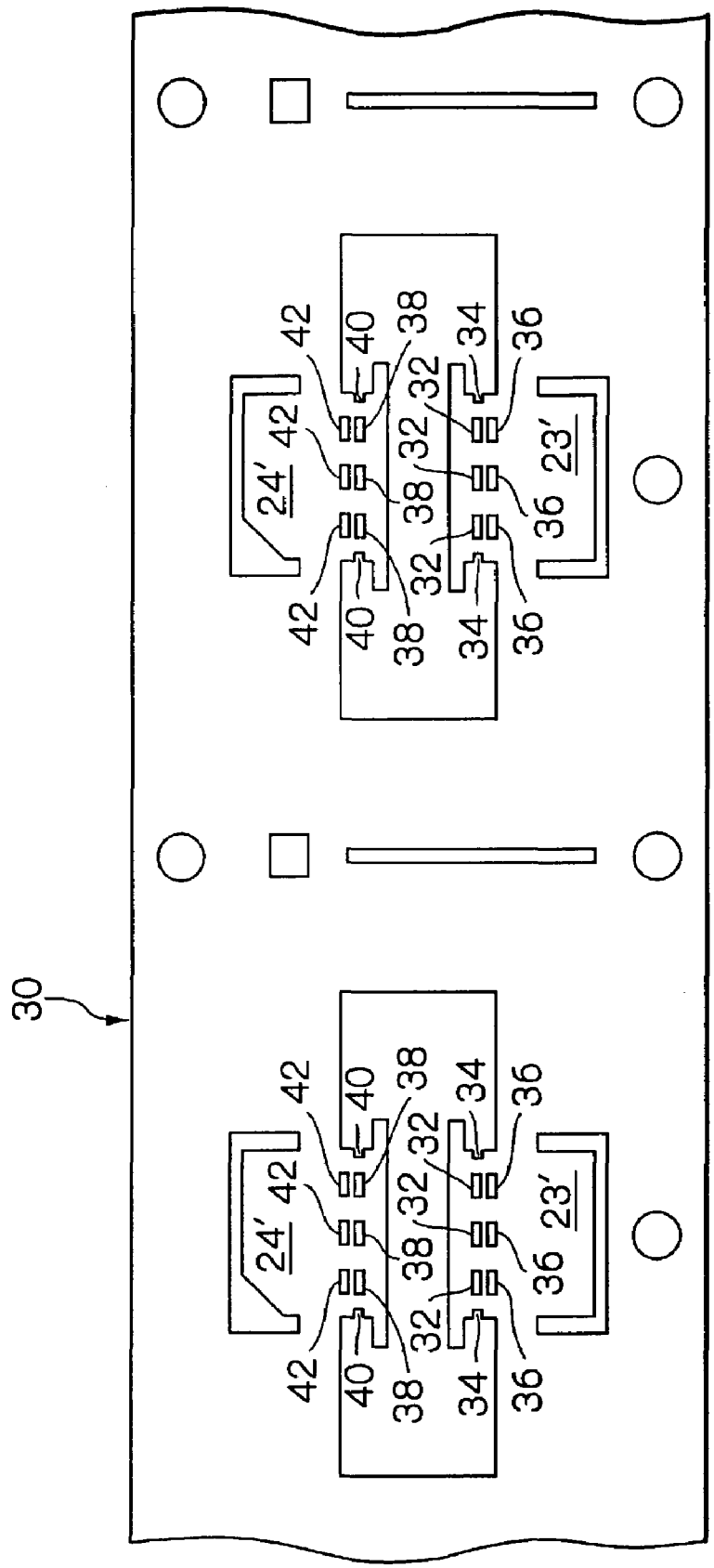

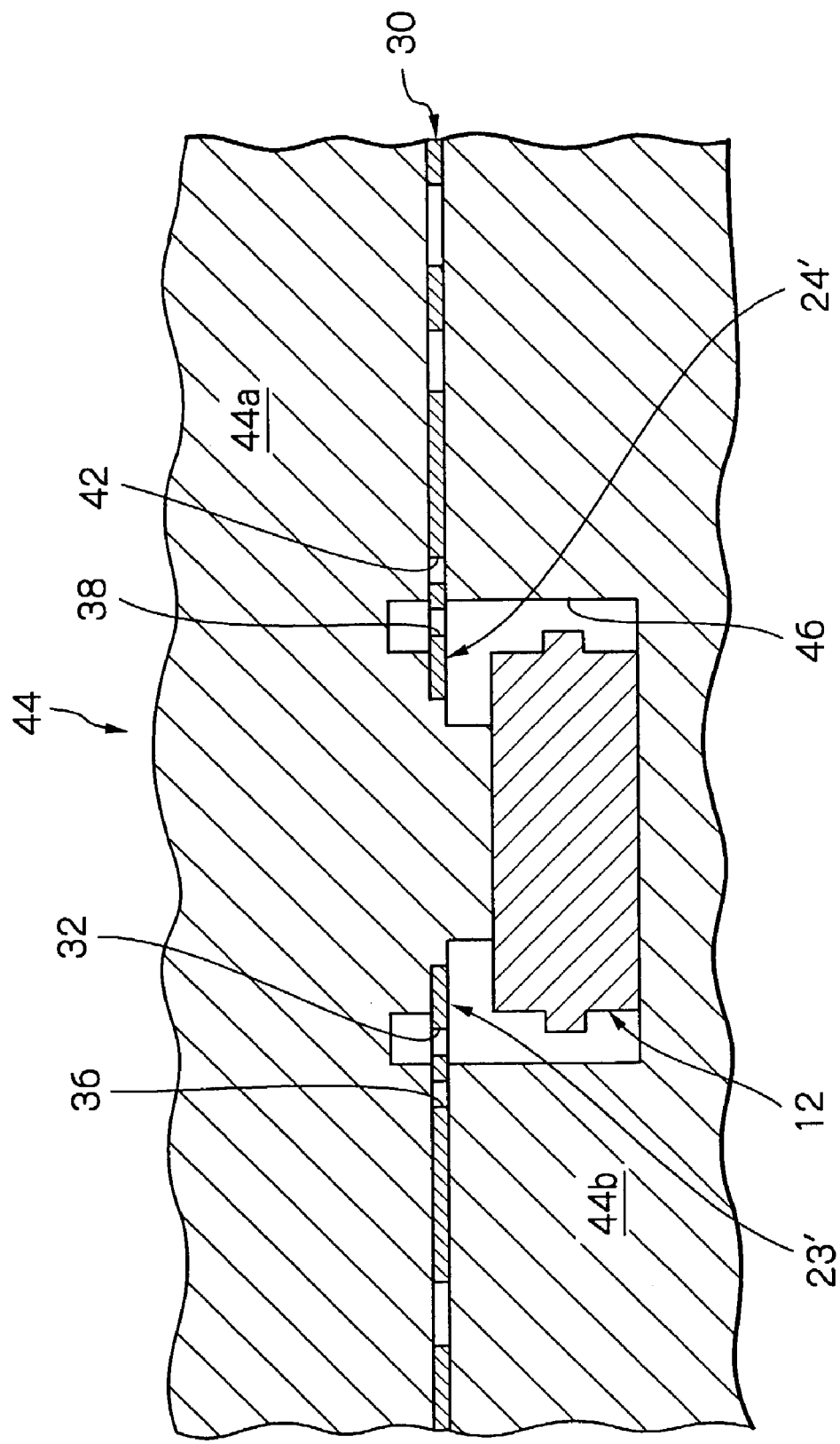

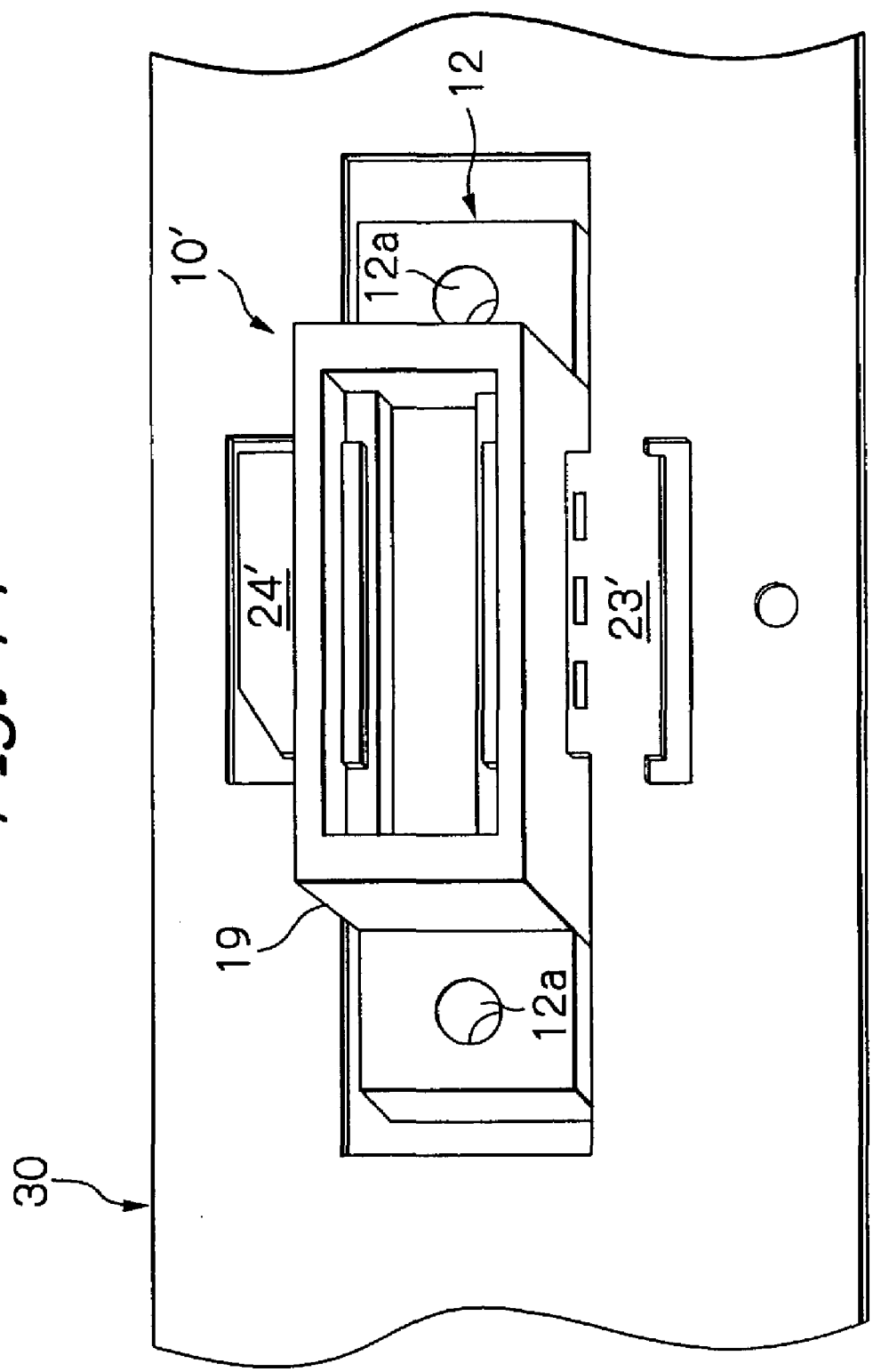

Fig. 12C
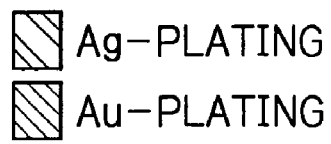
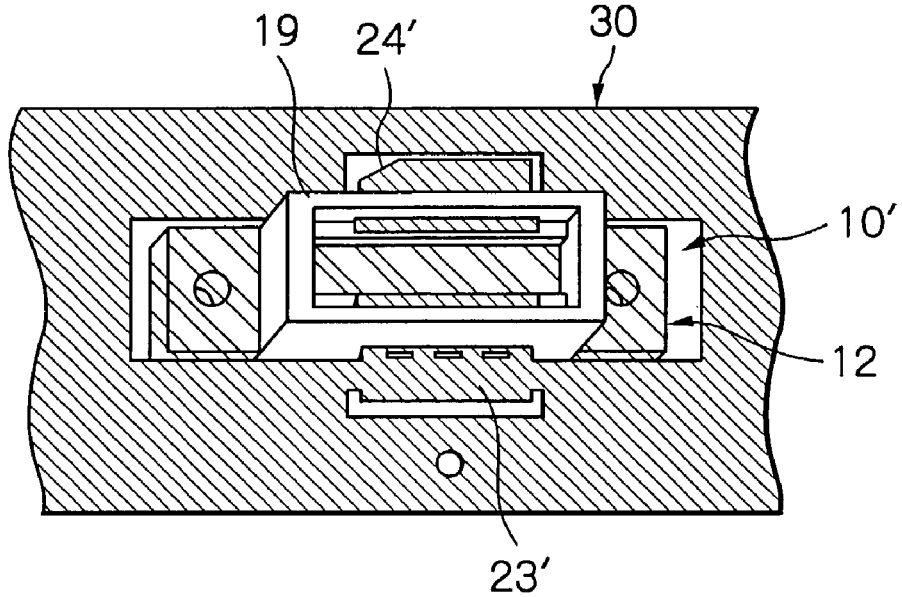
Fig. 12D
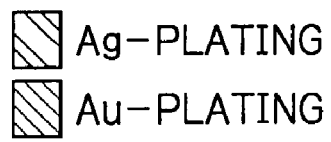
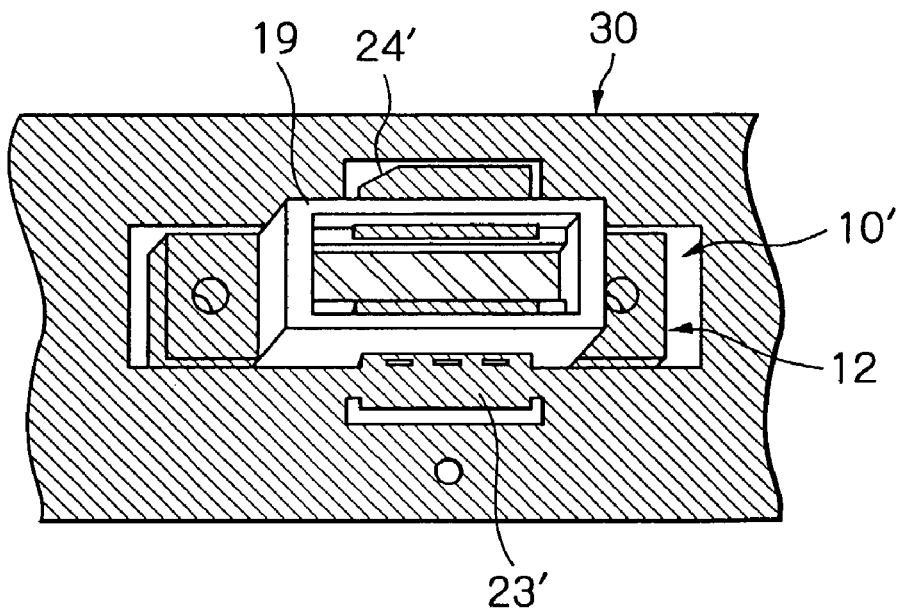

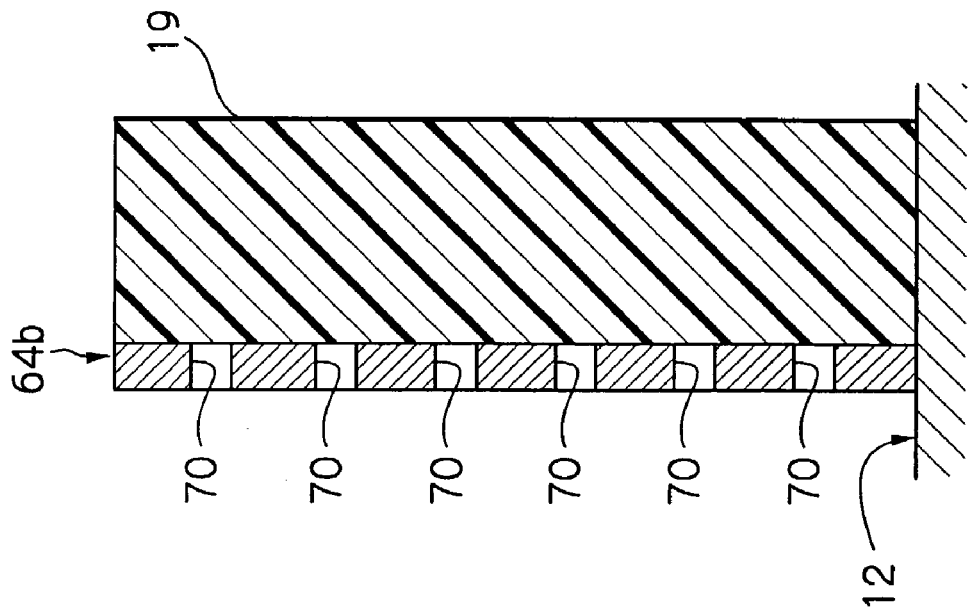
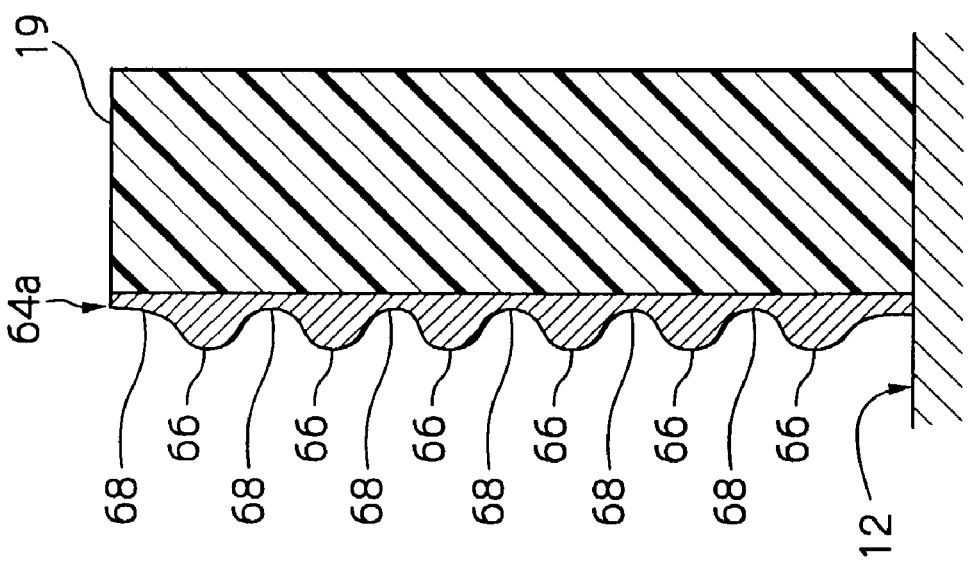

ELECTRONIC PRODUCT WITH HEAT RADIATING PLATE

BACKGROUND OF THE INVENTION

1. Field of the Invention

The present invention relates to an electronic product equipped with a heat radiating plate, and more particularly relates to an electronic product wherein an electronic component, including a high power transistor, is mounted on and adhered to a heat radiating plate, and is encapsulated in an enveloper.

2. Description of the Related Art

In general, a high power transistor, such as a power MOSFET or the like, which is frequently utilized in an analog amplifier or the like, generates a large amount of heat in operation. Thus, when an electronic component includes the high power transistor, an electronic product which uses the electronic component including the high power transistor, is equipped with a heat radiating plate made of a suitable metal material, such as copper or the like, to thereby facilitate radiation of heat from the electronic component.

The electronic product is provided with an enveloper for encapsulating the electronic component, to protect the electronic component from the outside, and leads of the electronic component pass and extend through the enveloper. When the enveloper is made of a suitable thermosetting resin, the electronic product is called a resin-sealed package. Also, when the enveloper is made of a suitable ceramic material, the electronic product is called a suitable ceramic package. Further, when the enveloper is made of a suitable metal material, the electronic product is called a metal package.

Conventionally, the electronic product of resin-sealed package type including, for example, the power MOSFET, is manufactured as explained below.

The electronic component is mounted on and adhered to the heat radiating plate, such that electrode pads of the electronic component, provided on a bottom face thereof, are electrically connected to the heat radiating plate. Also, the electronic component has two sets of electrode pads provided on a top face thereof, and the respective sets of electrode pads are connected to inner lead sections of two leads through bonding-wires. Thereafter, the electronic component and the inner lead sections are put in a molding cavity of a metal mold, and then sealing-resin is injected into the molding cavity, whereby the electronic component and the inner lead sections are enclosed with and encapsulated in the molded resin, with outer lead sections of the leads being protruded from the molded resin. Thus, in the conventional resin-sealed package, the electronic component and the inner lead sections are in direct contact with the molded resin.

When electric power consumption of the high power transistor is too large, it generates a very large amount of heat during an operation of the electronic component, so that the molded resin may be subjected to deterioration and exfoliation. In this case, the characteristics of the electronic products are changed, resulting in a decline in the operational reliability.

Also, as stated above, since the molded resin is in direct contact with the electronic component and the inner lead sections, it may serve as a dielectric layer, resulting in production of a parasitic capacitance. Accordingly, due to the interference based on the production of the parasitic capacitance, the frequency characteristics of the electronic product may be deteriorated in a high-frequency band of more than 1 GHz. In particular, the deterioration of the high-frequency characteristics causes serious problems in microwave applications of the electronic product.

In manufacturing the electronic product of ceramic or metal package type, the electronic component is mounted on and adhered to the heat radiating plate, such that the bottom electrode pads of the electronic component are electrically connected to the heat radiating plate. Then, a rectangular ceramic or metal frame member is securely attached to the heat radiating plate such that the electronic component is encompassed by the ceramic or metal frame. Thereafter, the respective two leads are put on tops of opposing side walls of the ceramic or metal frame, and the respective sets of top electrode pads are connected to the inner lead sections of the two leads through bonding-wires. After the electrical connections of the sets of top electrode pads to the inner lead sections of the lead are finished, a ceramic or metal lid member is securely adhered to the top opening end of the ceramic or metal frame, thereby forming the ceramic or metal package for accommodating and sealing the electronic component, with the outer lead sections of the leads being protruded from the interface between the frame member and the lid member.

The electronic product of ceramic or metal package type not be subjected to the aforesaid problems involved in the resin-sealed package. However, it is impossible to obtain the inherent advantages derived from the resin-sealed package, as stated below.

Historically, the ceramic or metal package has been used in a high-power transistor, such as the power MOSFET or the like, for obtaining a high operational reliability. However, it is desirable to realize an electronic product, including the high-power transistor, as a resin-sealed package, which can be manufactured with a high productivity at low cost.

Certainly, according to the ceramic or metal package, it is possible to obtain a higher operational reliability and a higher operational performance, in comparison with the resin-sealed package. Nevertheless, the manufacturing cost of the ceramic or metal package, including the cost of materials, is higher than that of the resin-sealed package.

Especially, before an operational reliability of the electronic product of ceramic package type can be enhanced, it is necessary to eliminate thermal stresses, resulting from variations in temperature, from the ceramic package as much as possible. To suppress the production of thermal stresses in the ceramic package, thermal expansion coefficients of materials for manufacturing must be matched with that of the ceramic enveloper. Nevertheless, the scope of choice of the materials for manufacturing the ceramic package is considerably restricted, because there are not many kinds of materials having thermal expansion coefficients which can be matched with that of the ceramic enveloper. Also, for metal materials, having thermal expansion coefficients which can be matched with that of the ceramic enveloper, although there are tungsten/copper alloy, molybdenum/copper alloy or the like, these metal materials are relatively expensive.

Accordingly, if the electronic product, which should be conventionally manufactured as a ceramic or metal package, is constituted as a resin-sealed package, it could be expected that the manufacturing cost of the electronic product can be considerably lowered.

SUMMARY OF THE INVENTION

Therefore, an object of the present invention is to provide an electronic product comprising a heat radiating plate, an electronic component, including a high power transistor, mounted on the heat radiating plate, and an enveloper securely attached to the heat radiating plate, which can be constituted such that a superior operational reliability can be ensured during a high power operation of the electronic product.

Another object of the present invention is to provide an electronic product of the above-mentioned type, which is constituted so as to improve high-frequency-operational characteristics thereof.

Yet another object of the present invention is to provide an electronic product of the above-mentioned type, which can be manufactured at a low cost.

In accordance with a first aspect of the present invention, there is provided an electronic product which comprises a heat radiating plate, an electronic component securely mounted on the heat radiating plate, an enveloper including a frame member securely associated with the heat radiating plate to encompass the electronic component, and a lid member securely attached to an upper opening end of the frame member, thereby accommodating and sealing the electronic component in the enveloper, and at least one electrically conductive element passing and extending through the frame member. According to the present invention, the frame member is made of a suitable resin material, and the lid member is made of one material selected from the group consisting of a ceramic material, a metal material, and a composite material.

The composite material may be composed of a suitable resin material, and a suitable filler material comprising either an electrically conductive material or a non-conductive material. Also, the composite material may be composed of a metal sheet element enveloped as a core body in a resin plate element. Further, the composite material may comprise a resin plate element in which a metal sheet element is embedded in a surface of the resin plate element such that a surface of the metal sheet element is exposed. Furthermore, the composite material may be composed of a non-conductive plate element, and an electronic conductive layer formed on a surface of the non-conductive plate element.

In accordance with a second aspect of the present invention, at least a part of the lid member exhibits an electrical conductivity. To this end, the lid member may be made of a suitable metal material. Also, the lid member may be made of an electrically conductive resin material. Further, the lid member may be constituted as a composite lid member composed of an electrically conductive element and a non-conductive element. Furthermore, the lid member may comprise a non-conductive plate element, and an electronic conductive layer formed on a surface of the non-conductive plate element. The electronic conductive layer may comprise a suitable metal sheet securely adhered to the surface of the non-conductive plate element, and otherwise may be formed by coating the surface of the non-conductive plate element with a suitable electrically conductive paste material.

Preferably, the electronic conductive layer is configured such that a thermal expansion difference between the non-conductive plate element and the electronic conductive layer is mitigated. To this end, the electronic conductive layer may be formed from a plurality of thick portions and a plurality of thin portions which are regularly arranged on the surface of the plate element for the mitigation of the thermal expansion difference between the non-conductive plate element and the electronic conductive layer. Also, the electronic conductive layer may be formed with a plurality of openings for the mitigation of the thermal expansion difference between the non-conductive plate element and the electronic conductive layer.

In the second aspect of the present invention, preferably, the frame member is provided with an electrically conductive element through which the lid member is electrically connected to the heat radiating plate. When the frame member is molded from the resin by a molding process, the electrically conductive element may be embedded in the molded frame member. Alternatively, the electrically conductive element may be constituted as an electronic conductive layer formed on an inner wall face of the frame member. In this case, the electronic conductive layer may comprise a suitable metal sheet securely adhered to the inner wall face of the frame member, and otherwise may be formed by coating the inner wall face of the frame member with a suitable electrically conductive paste material.

Preferably, the electronic conductive layer is configured such that a thermal expansion difference between the frame member and the electronic conductive layer is mitigated. To this end, the electronic conductive layer may be formed from a plurality of thick portions and a plurality of thin portions which are regularly arranged on the inner wall face of the frame member for the mitigation of the thermal expansion difference between the frame member and the electronic conductive layer. Also, the electronic conductive layer may be formed with a plurality of openings for the mitigation of the thermal expansion difference between the frame member and the electronic conductive layer.

In the first and second aspects of the present invention, preferably, the frame member may be molded from the resin by a molding process, and the heat radiating plate is configured so as to be mechanically engaged with the molded frame member. For example, the heat radiating plate may be formed with at least one recess embedded in the molded frame member, so as to be mechanically engaged with the molded frame member. Also, the heat radiating plate may be formed with at least one projection arranged on a wall face forming the recess, thereby further ensuring the mechanical engagement between the radiating plate and the molded frame member.

In the first and second aspects of the present invention, preferably, the electrically conductive element is configured so as to be mechanically engaged with the molded frame member. To this end, the electrically conductive element may be formed with at least one perforation embedded in the molded frame member so as to be mechanically engaged with the molded frame member. Also, the electrically conductive element may be formed with an alignment of perforations embedded in the molded frame member. Further, the electrically conductive element may be formed with an alignment of perforations and endmost cutouts embedded in the molded frame member.

The electrically conductive element may be formed with another alignment of perforations arranged along an outer wall face of the molded frame member, to thereby reduce a rigidity of an outer sections of the electrically conductive element.

The electrically conductive element may be formed with a first alignment of perforations embedded in the molded frame member to be mechanically engaged with the molded frame member, and a second alignment of perforations arranged along an outer wall face of the molded frame member to thereby reduce a rigidity of an outer sections of the electrically conductive element. Preferably, the perforations included in the second alignment are alternately arranged with respect to the perforations included in the first alignment.

The lid member may be formed with two rectangular land portions, which are integrally swelled from opposing wall faces thereof, and which are symmetrically arranged with respect to a geometrical neutral plane of the lid member, and each land portion is sized to be fitted into the upper opening end of the frame member.

In the first and second aspects of the present invention, the heat radiating plate includes inner and outer portions which are divided and defined by the frame member. In this case, preferably, the inner portion of the heat radiating plate, which is inside the frame member, is surfaced with silver-plating, and the outer portion of the heat radiating plate, which are outside the frame member, are surfaced with gold-plating. The electrically conductive element also includes inner and outer lead sections which are divided and defined by the frame member, and preferably the inner and outer lead section are surfaced with gold-plating.

In the first and second aspects of the present invention, preferably, the electrically conductive element is derived from a lead frame, and the heat radiating plate is prepared as a part which is independent from the lead frame.

In the first and second aspects of the present invention, the electronic component may comprises a high power transistor. In this case, the aforesaid electrically conductive element is defined as a first lead, and the electronic product further comprises a second lead passing and extending through the frame member. The respective first and second leads are electrically connected to the high power transistor so as to form input and output terminals of the high power transistor, and the heat radiating plate is electrically connected to form a grounded terminal of the high power transistor.

BRIEF DESCRIPTION OF THE DRAWINGS

The above objects and other objects will be more clearly understood from the description set forth below, with reference to the accompanying drawings, wherein:

FIG. 8 is a partial plan view of a lead frame used in manufacturing the electronic product;

FIG. 10 is a partial lateral cross-sectional view of the metal mold shown in FIG. 9;

FIG. 11 is a perspective view of an intermediate product for the electronic product;

FIG. 12C is a perspective view of the intermediate product subjected to a third plating process;

FIG. 12D is a perspective view of the intermediate product subjected to a fourth plating process;

FIG. 24 is a vertical cross-sectional view showing a modification of an electrically conductive layer formed on an inner wall face of a lateral side wall of a rectangular frame member which is used in the electronic product shown in FIG. 23; and FIG. 25 is a vertical cross-sectional view showing another modification of the electrically conductive layer formed on the inner wall face of the lateral side wall of the rectangular frame member which is used in the electronic product shown in FIG. 23.

DESCRIPTION OF THE PREFERRED EMBODIMENTS

Figure 1:
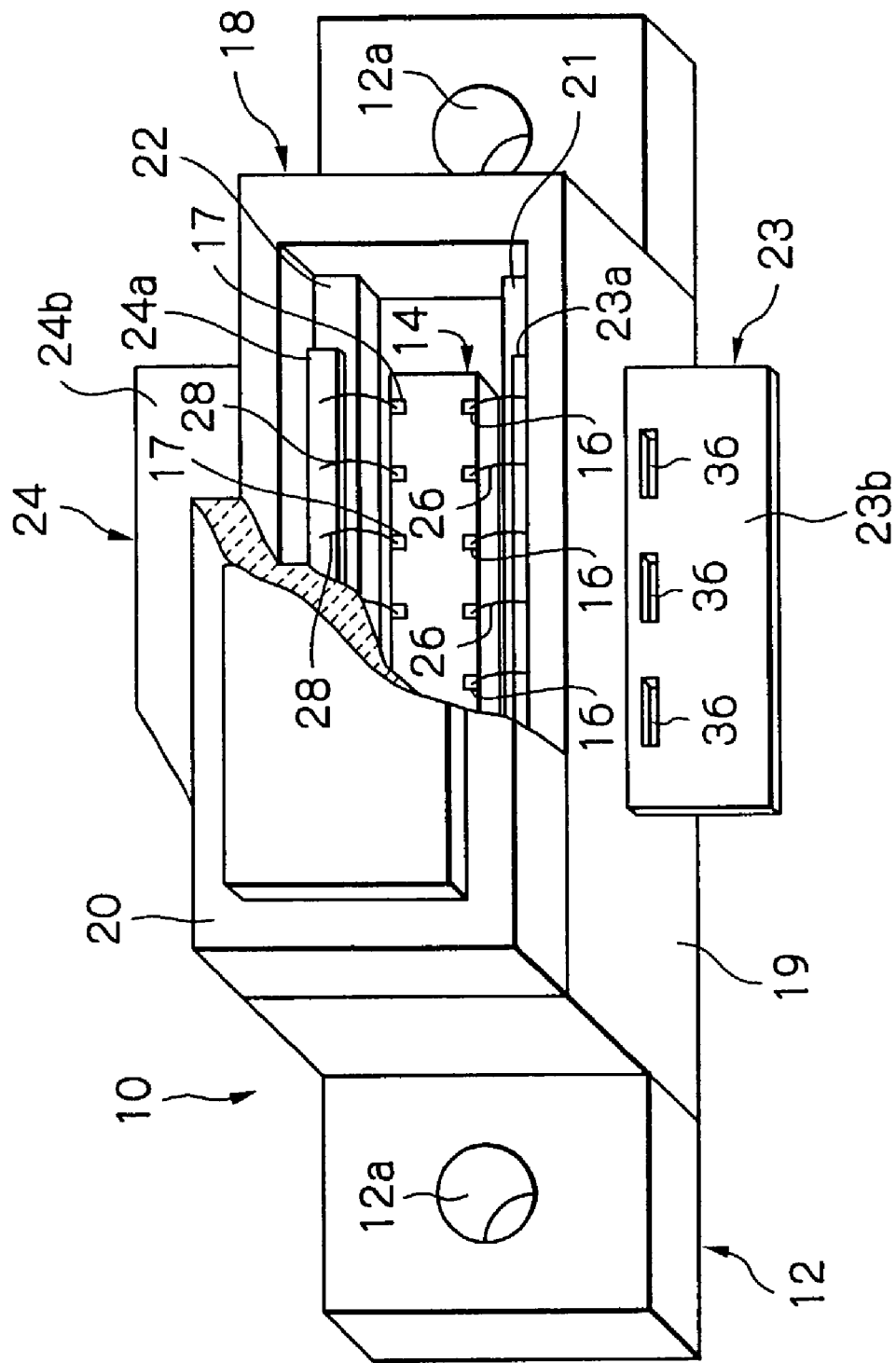
FIG. 1 is a partially-cutaway perspective view of a first embodiment of an electronic product according to the present invention.

With reference to FIGS. 1 to 8, a first embodiment of an electronic product according to the present invention is generally indicated by reference 10.

As shown in FIGS. 1 to 4, the electronic product 10 comprises a heat radiating plate 12 made of a suitable metal material such as copper or the like, and the heat radiating plate 12 is subjected to electroplating processes, as stated in detail hereinafter. The heat radiating plate 12 is formed with a pair of screw holes 12a at the ends thereof, and the screw holes 12a are used for attaching the electronic product 10 to a suitable base frame, such as an aluminum chassis or the like, by screws (not shown), when being assembled in a piece of electronic equipment.

Also, the electronic product 10 comprises an electronic component 14 mounted on and adhered to the heat radiating plate 12. In this embodiment, the electronic component 14 includes a power MOSFET as a high power transistor, which is utilized in an analog amplifier or the like, and is provided with three sets of pads: first, second and third sets of pads.

Figure 2:
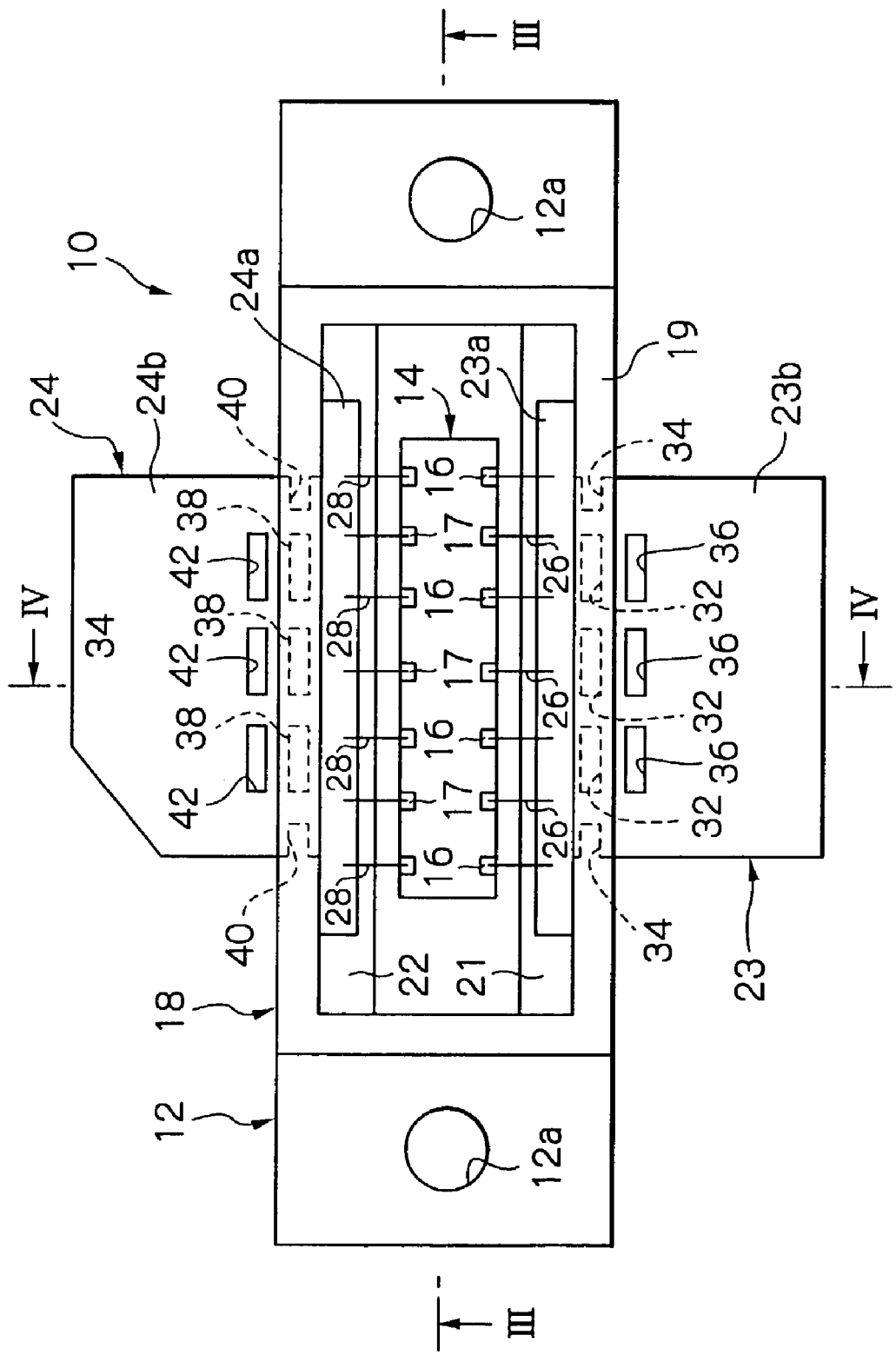
FIG. 2 is a plan view of the electronic product, shown in FIG. 1, from which a lid member is removed.
Figure 3:
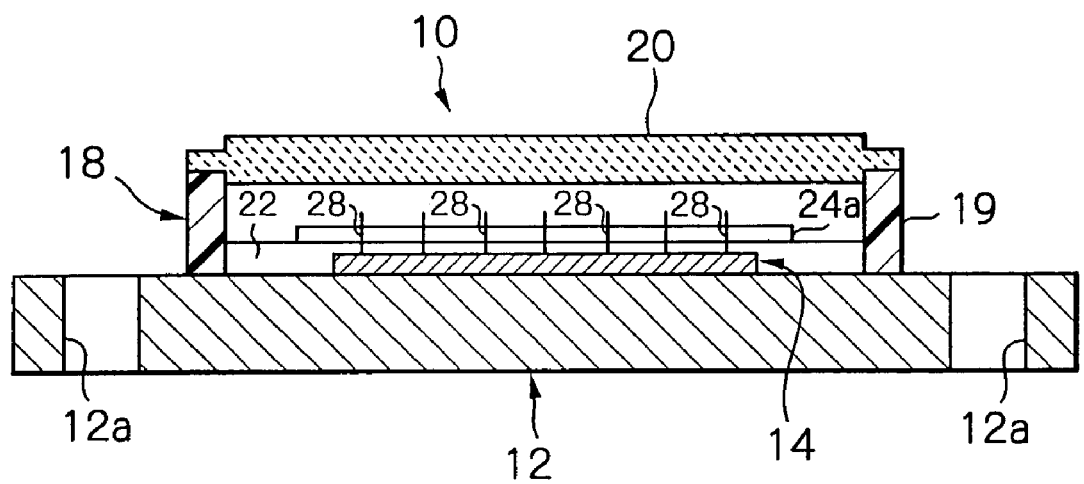
FIG. 3 is a longitudinal cross-sectional view, taken along the III—III line of FIG. 1, but illustrating the lid member.

In particular, as shown in FIGS. 1 and 2, the first set of pads, indicated by reference 16, is provided on a top face of the electronic component 14, and forms a drain (D) of the power MOSFET. Similarly, the second set of pads, indicated by reference 17, is provided on the top face of the electronic component 14, and forms a gate (G) of the power MOSFET. The third set of pads is provided on a bottom face of the electronic component 14 (not visible), and forms a source (S) of the power MOSFET. When the electronic component 14 is mounted on and adhered to the heat radiating plate 12, the third set of pads are electrically connected to the heat radiating plate 12, and thus the heat radiating plate 12 also serves as the source terminal (S) of the power MOSFET.

The electronic product 10 further comprises an enveloper 18 for encapsulating the electronic component 14 to thereby protect it from the outside. The enveloper 18 comprises a rectangular frame member 19 made of a suitable thermosetting resin such as epoxy resin or the like, and a lid member 20 securely attached to a top opening end of the frame member 19. In this first embodiment, the lid member 20 is made of a suitable ceramic material.

Figure 5:
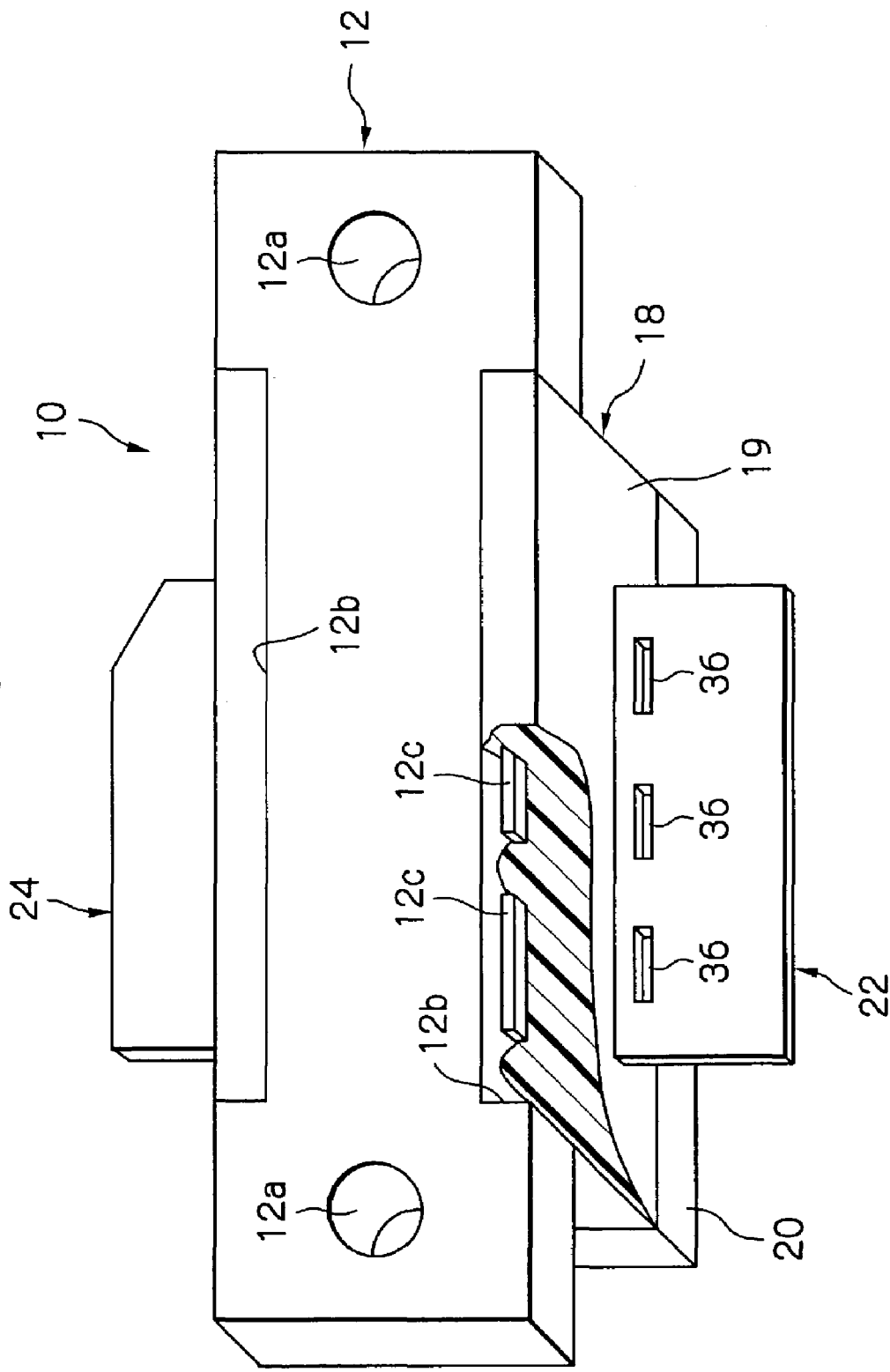
FIG. 5 is a partially-cutaway perspective view of the electronic product shown in FIG. 1, observed from a bottom side of the electronic product.
Figure 6:
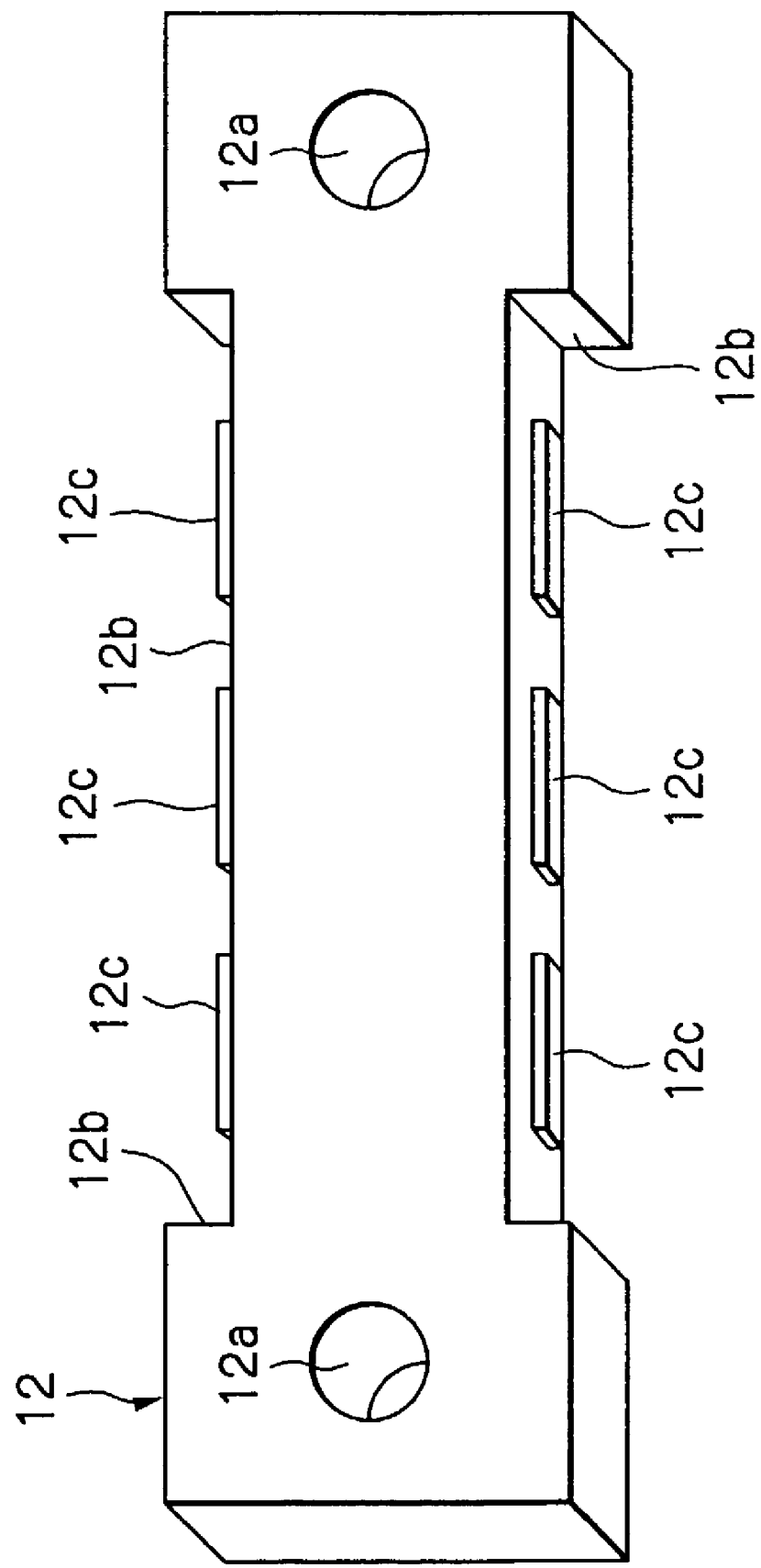
FIG. 6 is a perspective view of a heat radiating plate forming a part of the electronic product.

The rectangular frame member 19 is formed by a molding process, and is mechanically engaged with and attached to the heat radiating plate 12 at a bottom end thereof when being molded. To ensure a securely-mechanical engagement between the heat radiating plate 12 and the frame member 14, as best shown in FIGS. 5 and 6, the heat radiating plate 12 is provided with a pair of side recesses 12b formed along the opposing longitudinal sides thereof, and three projections 12c are integrally protruded from the inmost wall face of each side recess 12b. Thus, as best shown in FIG. 5, it is possible to establish the secure mechanical attachment of the frame member 14 to the heat radiating plate 12.

As is apparent from FIGS. 1 to 4, the rectangular frame member 14 is provided with a pair of shelf elements 21 and 22, which are integrally protruded from the inner wall faces of the opposing longitudinal side walls of the frame member 14, and which are extended between the opposing lateral side walls of the frame member 14. Note that the functions of the shelf elements 21 and 22 are explained hereinafter.

The lid member 20 may be securely adhered to the top opening end of the frame member 19, using a suitable adhesive agent, to thereby close the top opening end of the frame member 19. Thus, the electronic component 14 is encapsulated in the enveloper 18, whereby it is possible to seal and protect the electronic component 14 from the outside.

Figure 7A:
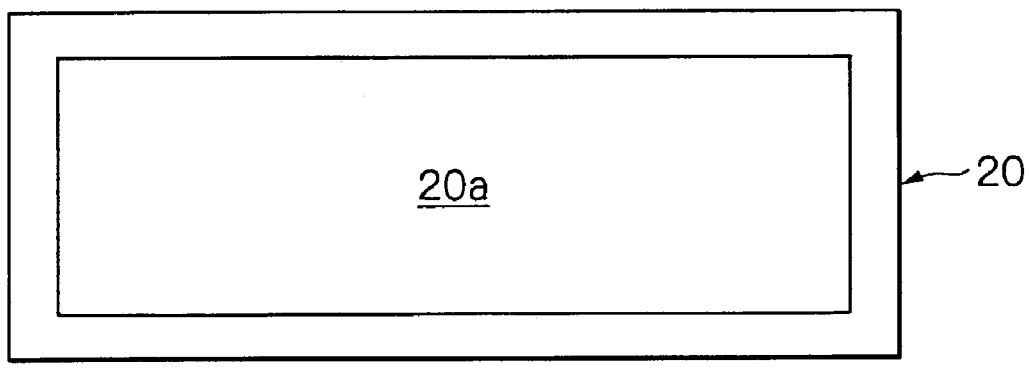
FIG. 7A is a plan view of the lid member.
Figure 7B:
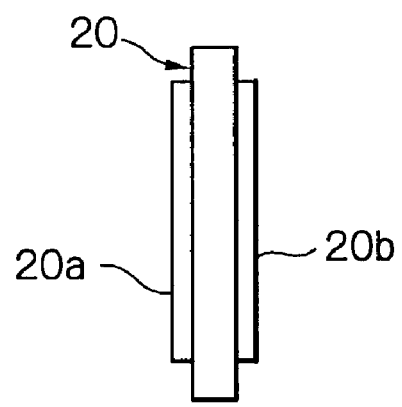
FIG. 7B is a side view of the lid member shown in FIG. 7A.
Figure 7C:
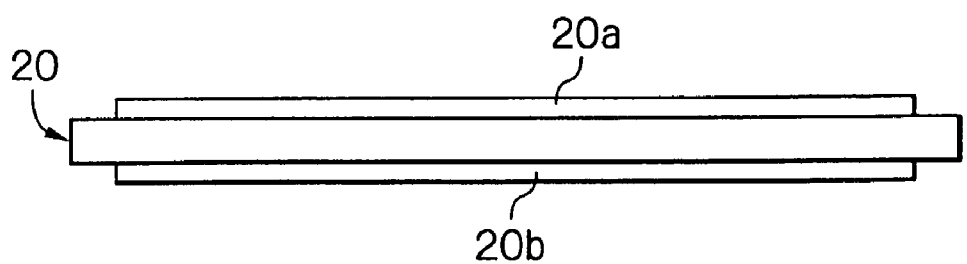
FIG. 7C is an elevation view of the lid member shown FIG. 7A.

Preferably, the lid member 20 is configured as shown in FIGS. 7A to 7C. In particular, the lid member 20 is shaped as a rectangular plate having the same rectangular profile as that of the frame member 19, and is formed with two rectangular land portions 20a and 20b integrally swelled from the opposing wall faces thereof. The land portions 20a are symmetrically arranged with respect to a geometrical neutral plane of the lid member 20, and each land portion (20a, 20b) is sized so as to be fitted into the upper opening end of the rectangular frame member 19. Thus, it is possible to easily and accurately attach the lid member 20 to the upper opening end of the frame member 19. Also, although the lid member 20 is subjected to variations in temperature, due to the symmetrical configuration of the lid member 20, it is possible to considerably reduce warpage of the lid member 20.

Figure 4:
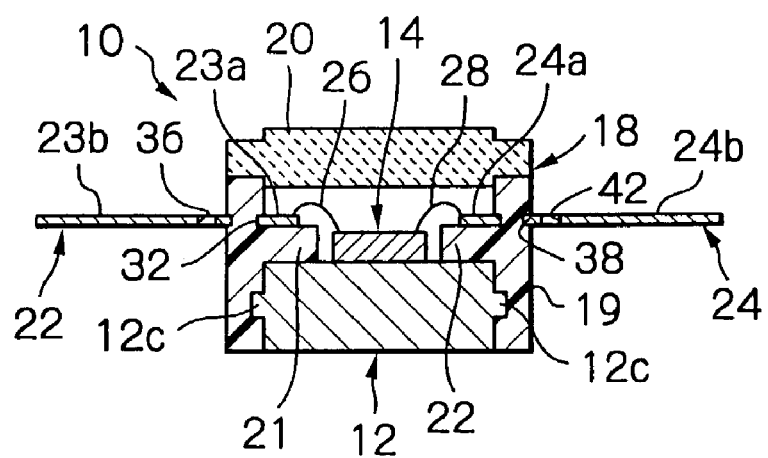
FIG. 4 is a lateral cross-sectional view, taken along the IV—IV line of FIG. 1, but illustrating the lid member.

Furthermore, the electronic product 10 comprises a pair of leads 23 and 24 made of a suitable metal such as copper or the like, and the respective leads 23 and 24 pass and extend through the opposing longitudinal side walls of the frame member 19, as shown in FIGS. 1, 2, and 4. Each of the leads 23 and 24 is mechanically held by the corresponding longitudinal side wall of the frame member 19 when the frame member 19 is molded. Note that, similar to the heat radiating plate 12, the pair of leads 23 and 24 are also subjected to electroplating processes, as stated in detail hereinafter.

With reference to FIG. 8, a part of a lead frame 30 is shown as a plan view, and the pair of leads 23 and 24 are obtained from the lead frame 30. The lead frame 30 comprises an elongated metal (e.g. copper) sheet in which pairs of lead patterns 23' and 24' are successively formed in an openwork manner. As stated hereinafter, when the rectangular frame member 19 is molded by a metal mold, a pair of lead patterns 23' and 24' is disposed in a molding cavity of the metal mold together with the heat radiating plate 12. After the molding of the frame member 19 is completed, the pair of lead patterns 23' and 24' is cut off from the lead frame 30, thereby producing the pair of leads 23 and 24.

As shown in FIG. 8, each lead pattern 23' is formed with a first alignment of three slots or perforations 32 and two endmost cutouts 34, and a second alignment of three through slots or perforations 36. Similarly, each lead pattern 24' is formed with a first alignment of three slots or perforations 38 and endmost cutouts 40 and a second alignment of three slots or perforations 42.

As best shown in FIG. 2, when the rectangular frame member 19 is molded, the first alignment of perforations 32 and endmost cutouts 34 in the lead pattern 23' and the first alignment of perforations 38 and endmost cutouts 40 in the lead pattern 24' are respectively buried in the opposing longitudinal side walls of the frame member 19, resulting in a mechanical and secure engagement between the lead patterns 23' and 24' and the opposing longitudinal side walls of the frame member 19. Thus, it is possible to mechanically and firmly hold the respective leads 23 and 24 by the opposing longitudinal side walls of the frame member 19.

The lead 23 has inner and outer lead sections 23a and 23b, which are divided and defined by the corresponding longitudinal side wall of the frame member 19. also, the lead 24 has inner and outer lead sections 24a and 24b, which are divided and defined by the corresponding longitudinal side wall of the frame member 19. Namely, the respective inner lead sections 23a and 24a are protruded from the inner wall faces of the opposing longitudinal side walls of the frame member 19, and the respective outer lead sections 23b and 24b are protruded from the outer wall faces of the opposing longitudinal side walls of the frame member 19. Note that the respective inner lead sections 23a and 24a are laid on the shelf elements 21 and 22.

As best shown in FIGS. 1 and 2, the inner lead section 23a is electrically connected to the first set of pads 16 with bonding-wires 26, and thus the outer lead section 23b forms the drain terminal (D) of the power MOSFET. Similarly, the inner lead section 24a is electrically connected to the second set of pads 17 with bonding-wires 28, and thus the outer lead section 24b forms the gate terminal (G) of the power MOSFET.

The electronic product 10 as mentioned above may be manufactured below.

Figure 9:
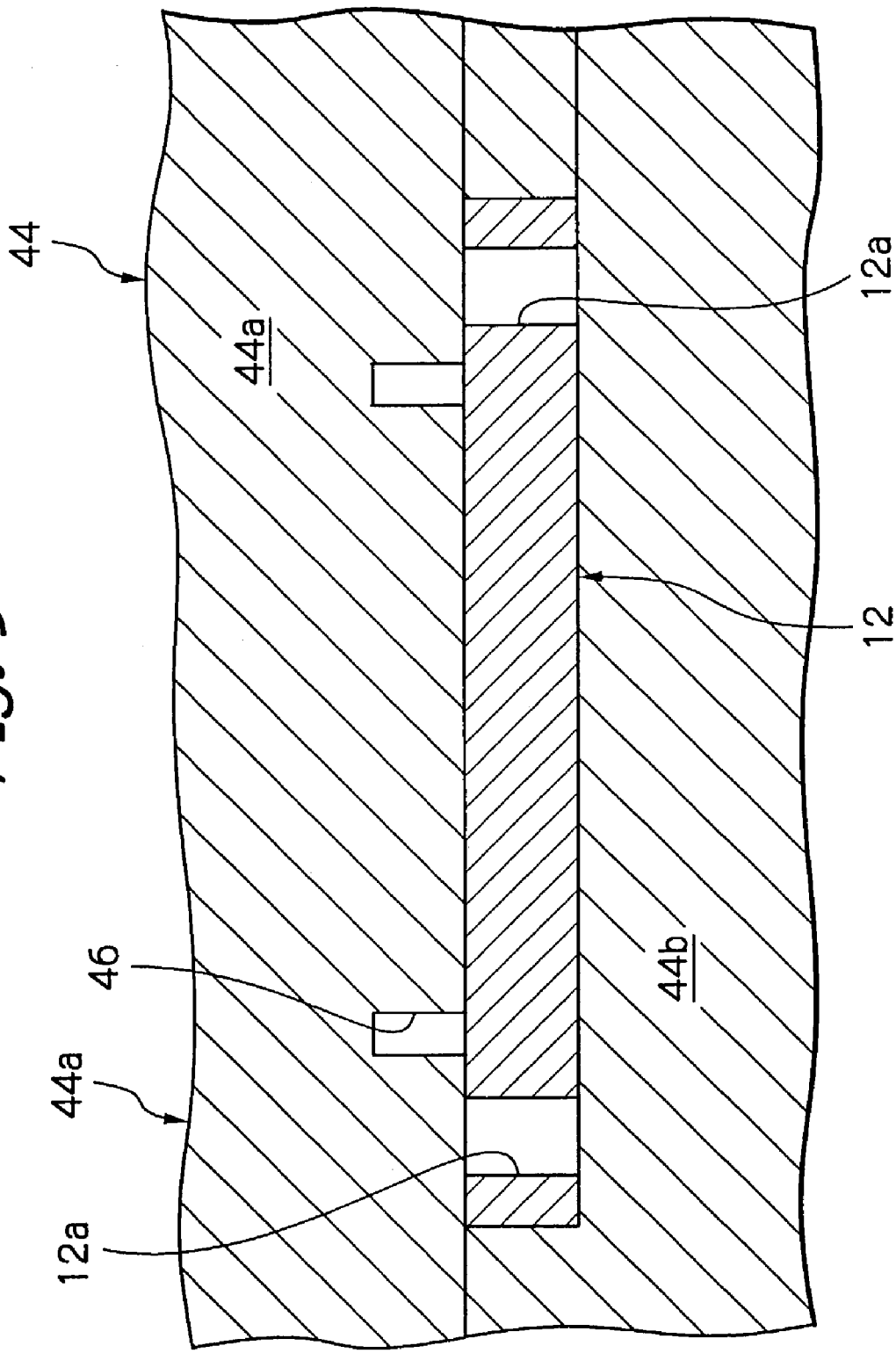
FIG. 9 is a partial longitudinal cross-sectional view of a metal mold for molding a rectangular frame member forming a part of the electronic product.

First, referring to FIGS. 9 and 10, the aforesaid metal mold for molding the rectangular frame member 19 is generally indicated by reference 44. The metal mold 44 comprises upper and lower mold dies 44a and 44b, which define a molding cavity 46, corresponding to the profile of the rectangular frame member 19, when being combined with each other. Namely, an upper half of the molding cavity 46 is defined by the upper mold die 44a, and a lower half of the molding cavity 46 is defined by the lower mold die 44b.

As shown in FIGS. 9 and 10, the heat radiating plate 12 and the pair of lead patterns 23' and 24' are sandwiched by the upper and lower mold dies 44a and 44b such that these elements 12, 23', and 24' are disposed in place in the molding cavity 46. Then, liquid epoxy resin is injected into the molding cavity 26, and is hardened. As is apparent from FIG. 10, the perforations 32 and 38 and cutouts 34 and 40 of the lead patterns 23' and 24' are filled with the injected resin, and thus the lead patterns 23' and 24' are mechanically and firmly engaged with the molded piece when being hardened. Thereafter, the metal mold 44 is opened, thereby obtaining an intermediate product 10' as shown in FIG. 11.

Then, the intermediate product 10' is subjected to plating processes in accordance with a plating flow diagram shown in FIGS. 12A to 12D.

Figure 12A:
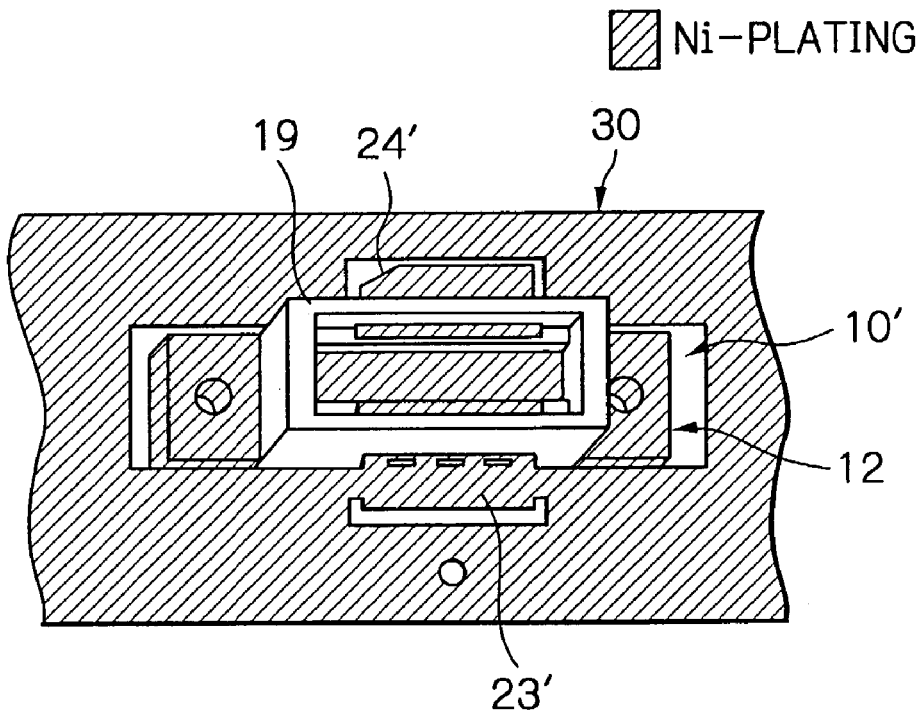
FIG. 12A is a perspective view of the intermediate product subjected to a first plating process.

In a first plating process shown in FIG. 12A, both the heat radiating plate 12 and the lead frame 30 (including the lead patterns 23' and 24') are plated with nickel (Ni), as represented by hatching in FIG. 12A. Note that areas of these elements 12 and 30, covered by the resin material of the rectangular frame member 19, cannot be subjected to the nickel-plating.

Figure 12B:
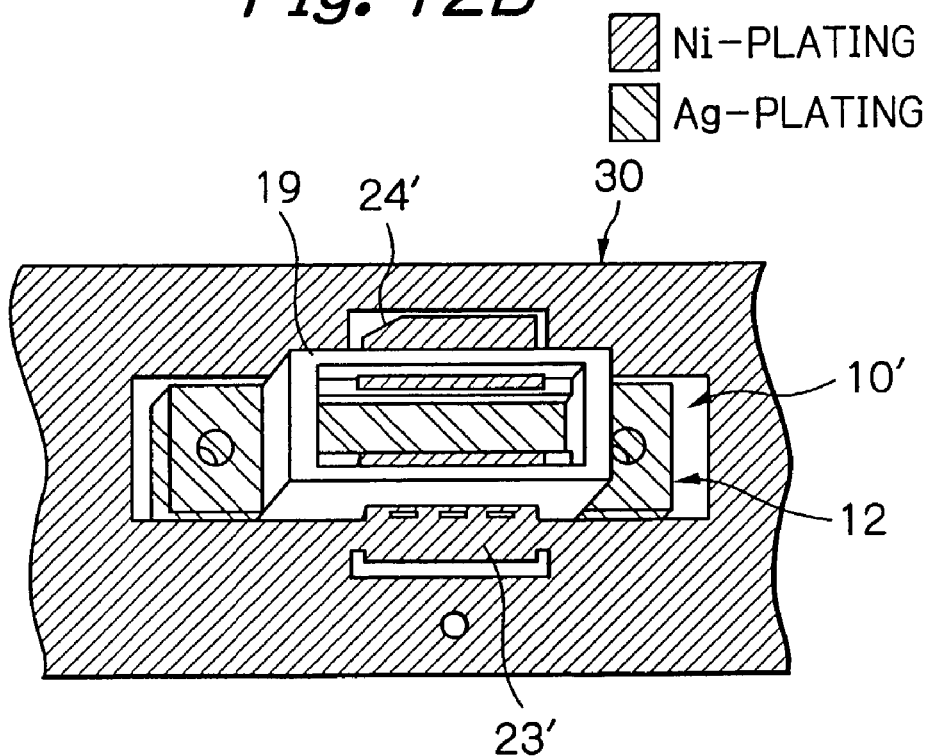
FIG. 12B is a perspective view of the intermediate product subjected to a second plating process.

In a second plating process shown in FIG. 12B, the nickel-plating of the heat radiating plate 12 are further plated with silver (Ag), using an electroplating method, as represented by hatching in FIG. 12B. In particular, the heat radiating plate 12 is immersed together with the lead frame 30 in a solution containing Ag ions, and a negative voltage is applied to the heat radiating plate 12, whereby the nickel-plating of the heat radiating plate 12 is further subjected to the silver plating.

In a third plating process shown in FIG. 12C, the nickel-plating surfaces of the lead frame 30 (including the lead patterns 23' and 24') are further plated with gold, using an electroplating method, as represented by hatching in FIG. 12C. In particular, the lead frame 30 is immersed together with the heat radiating plate 12 in a solution containing Au ions, and a negative voltage is applied to the lead frame 30, whereby the nickel-plating of the lead frame 30 is further subjected to the gold-plating.

In a fourth plating process shown in FIG. 12D, the outer portions of the heat radiating plate 12, which are outside the rectangular frame member 19, are further plated with gold, using an electroplating method, as represented by hatching in FIG. 12D. In particular, the inner portion of the heat radiating plate 12, which is inside the rectangular frame member 19, is masked with a photo-resist or the like, and the heat radiating plate 12 is immersed together with the lead frame 30 in a solution containing Au ions, and a negative voltage is applied to the heat radiating plate 12, whereby only the silver-plating of the outer portions of the heat radiating plate 12 is further subjected to the gold-plating.

Then, the electronic component 14 is mounted on and adhered to the silver-plating surface of the heat radiating plate 12, using a suitable electrically conductive bonding agent. Accordingly, as already stated, the third set of pads (not visible), provided on the bottom face of the electronic component 14, are electrically connected to the heat radiating plate 12, and thus the heat radiating plate 12 serves as the source terminal (S) of the power MOSFET.

Subsequently, a wire-bonding process is performed to establish the electrical connections between the first set of pads 16 and the inner lead section 23a of the lead pattern 23' with the bonding-wires 26, and between the second set pads 17 and the inner lead section 24a of the lead pattern 24' with the bonding-wires 28. During the wire-bounding process, the respective inner lead sections 23a and 24a lie on the shelf elements 21 and 22, to thereby prevent deformation of the inner lead sections 21 and 22.

After the wire-bounding process is finished, the intermediate product 10' is removed from the lead frame 30 by cutting off the lead patterns 23' and 24' therefrom, and then the top opening end of the frame member 19 is closed by the lid member 20, thereby encapsulating the electronic component 14 in the enveloper 18, resulting in a completion of the manufacture of the electronic product 10 in which the electronic component 14 is sealed and protected in the enveloper 18 from the outside.

According to the aforesaid manufacturing process, it is possible to obtain various advantages as explained below.

For example, the molding process contributes to a flattening of the heat radiating plate 12. In particular, the heat radiating plate 12 is frequently produced from a copper sheet, using a punching machine. In this case, the heat radiating plate 12 has a residual strain or stress, which is inevitably brought about when being punched, and thus may be warped due to the residual strain or stress. However, it is possible to flatten the warped heat radiating plate 12 during the molding process, because the warped heat radiating plate 12 is clamped by the upper and lower mold dies 44a and 44b while the metal mold 44 is closed, as is apparent from FIGS. 9 and 10.

In short, since the rectangular frame member 19 is molded in the metal mold 44 so as to be mechanically engaged with a part of the heat radiating plate 12, the heat radiating plate 12 is necessarily clamped by the upper and lower mold dies 44a and 44b, resulting in achievement of the flattening of the warped heat radiating plate 12.

Also, in accordance with the aforesaid manufacturing process, since the heat radiating plate 12 is prepared as a part which is independent from the lead frame 30, and since the heat radiating plate 12 and the lead frame 30 are electrically isolated from each other, it is possible to individually and separately electroplate the heat radiating plate 12 and the lead frame 30 without masking either of the heat radiating plate 12 or the lead frame 30. For example, as shown in FIG. 12B, while the heat radiating plate 12 is subjected to the silver-plating, it is unnecessary to mask the lead frame 30. Thus, the electroplating processes (FIGS. 12A to 12D) can be easily performed at a low cost.

In addition, due to the fact that the heat radiating plate 12 is independent from the lead frame 30, the heat radiating plate 12 can be made thicker than the lead frame 30, and thus it is possible to facilitate the radiation of heat from the heat radiating plate 12.

The electronic component 10 itself according to the present invention also features various advantages.

For example, with the arrangement of the electronic component 10, since the electronic component 14, the inner lead sections 23a and 24a, and the bonding-wires 26 and 28 are arranged in the interior space of the enveloper 18, i.e. since these elements (14, 23a, 24a, 26, 28) are not directly covered with and sealed in a molded resin, the electronic component 10 has no relation with problems accompanying production of parasitic capacitance, resulting in an improvement in high frequency characteristics thereof. Also, although the surface of the electronic component 14 is raised up due to the heating generated in a high-power operation of the electronic product 10, the enveloper 18 cannot be subjected to a thermal influence from the heated electronic component 14, because the enveloper 18 is not in direct contact with the electronic component 14, resulting in improvement and preservation of an operational reliability of the electronic product 10 during a high-power-output operation.

Also, due to the formation of the second alignments of perforations 36 and 42 in the outer lead sections 23b and 24b, rigidity of the outer lead sections 23b and 24b is reduced, whereby the rectangular frame member 19 can be protected from being damaged. In particular, for example, while the lead patterns 23' and 24' are cut off from the lead frame 30 and/or while the electronic product 10 is assembled in a piece of electronic equipment, an excessive external force may be exerted on the outer lead sections 23b and 24b. If the rigidity of the outer lead sections 23b and 24b is too large, the excessive external force may damage the frame member 19. However, in reality, the outer lead sections 23b and 24b exhibit a flexibility based on the reduction of the rigidity of the outer sections 23b and 24b. Thus, the excessive external force may be absorbed by the deformation of the outer lead sections 23b and 24b, resulting in the protection of the lead sections 23b and 24b from the damage.

Further, the electronic product 10 entirely exhibits a superior corrosive resistance, because the outer portions of the heat radiating plate 12, which are outside the frame member 19, are surfaced with the gold-plating, and because the outer lead sections 23b and 24b of the leads 23 and 24 are surfaced with the gold-plating. In addition, due to the gold-plating of the inner and outer lead sections (23a; 23b and 24a; 24b) of the leads 23 and 24, it is possible to improve anti-migration characteristics on the leads 23 and 24, resulting in promotion of operational reliability of the electronic product 10. Also, since the inner area of the heat radiating plate 12, encompassed by the frame member 19, is surfaced not with the gold-plating but the silver-plating, it is possible to reduce cost required for the plating processes.

Furthermore, it is possible to obtain an advantage from the formation of the first alignment of perforations (32, 38) and endmost cutouts (34, 40) and the second alignment of perforations (36, 42) in the lead (23, 24).

In particular, when the electronic product 10 is assembled in a piece of electronic equipment, it is necessary to connect the outer lead sections 23b and 24b to electrical terminals, using solder and flux. In this case, fused solder and flux may be penetrated into interfaces between the resin frame member 19 and the leads 23 and 24, and may be further invaded into the interior of the enveloper 18 through the aforesaid interfaces. However, it is possible to impede the penetration of the fused solder and flux into the interfaces between the resin frame member 19 and the leads 23 and 24 and the invasion of the fused solder and flux into the interior of the enveloper 18 through the aforesaid interfaces, due to the provision of the first alignment of perforations (32, 38) and endmost cutouts (34, 40) and the second alignment of perforations (36, 42) in the lead (23, 24).

Figure 13:
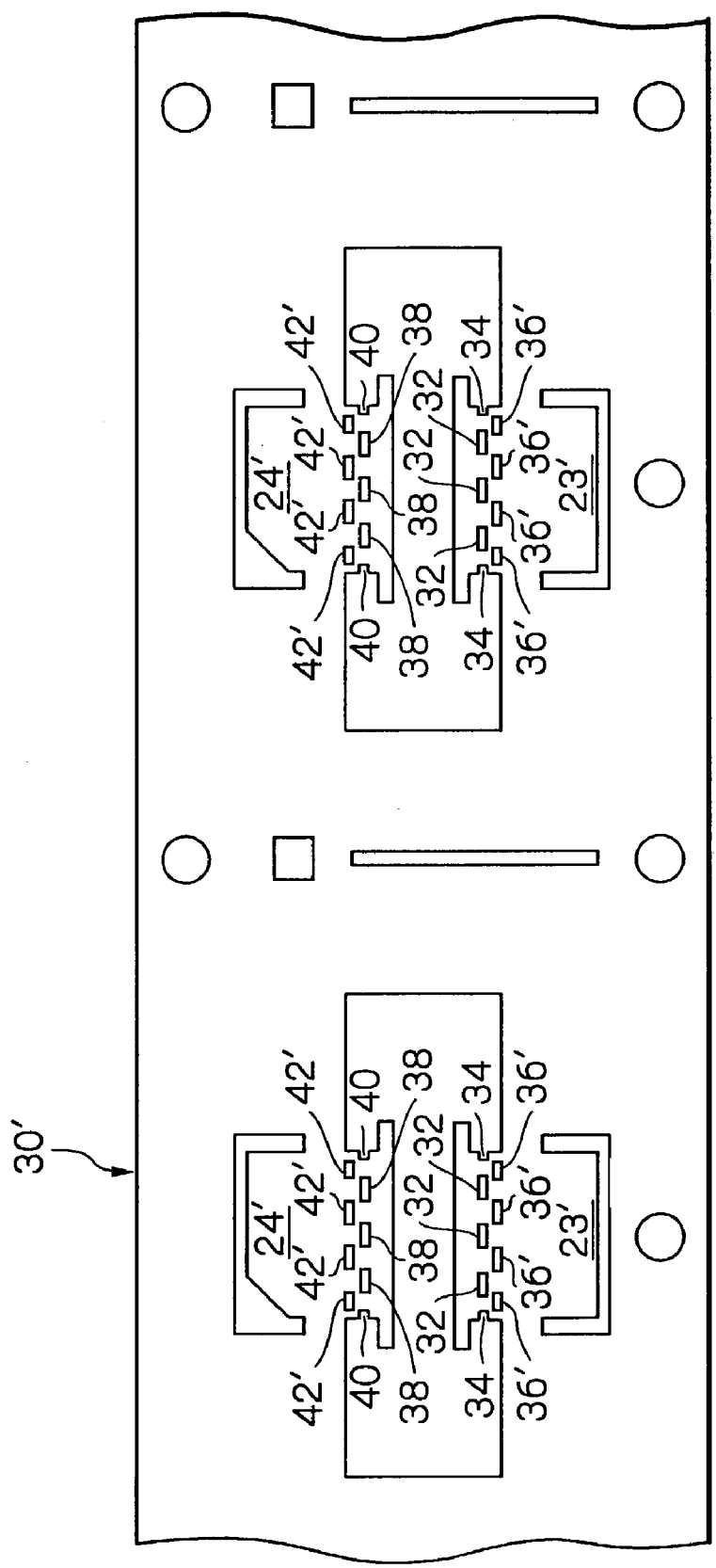
FIG. 13 is a partial plan view of a modification of the lead frame shown in FIG. 8.

FIG. 13 shows a modification of the lead frame 30 shown in FIG. 8. In this drawing, the modified lead frame is generally indicated by reference 30', and the elements similar to those of the lead frame 30 are indicated by the same references elements. The modified lead frame 30' is identical to the lead frame 30 of FIG. 8, except that a second alignment of four slots or perforations 36' is substituted for the second alignment of three slots or perforations 36 in the lead pattern 23', and that a second alignment of four slots 42' is substituted for the second alignment of slots or perforations 42 in the lead pattern 24'.

As shown in FIG. 13, in the lead pattern 23', the four perforations 36' included in the second alignment are alternately arranged with respect to the three perforations 32 and endmost cutouts 34 included in the first alignment. In particular, each of the two endmost perforations 36' in the first alignment is opposed to a space area between the corresponding endmost cutout 34 and the adjacent perforations 32, and each of the two middle slots 36', intervened between the two endmost perforations 36', is opposed to a space area between the two corresponding adjacent perforations 32 in the second alignment. The same is true for a relationship between the second alignment of four perforations 42' and the first alignment of three perforations 38 and two endmost cutouts 40, formed in the lead pattern 24'.

When the modified lead frame 30' is used for the manufacture of the electronic product 10, it is possible to more effectively impede the penetration of the fused solder and flux into the interfaces between the resin frame member 19 and the leads 23 and 24 and the invasion of the fused solder and flux into the interior of the enveloper 18 through the aforesaid interfaces, due to the alternate arrangement of the four perforations (36', 42') in the second alignment with respect to the three perforations (32, 38) and two endmost cutouts (34, 40) in the first alignment.

Figure 14:
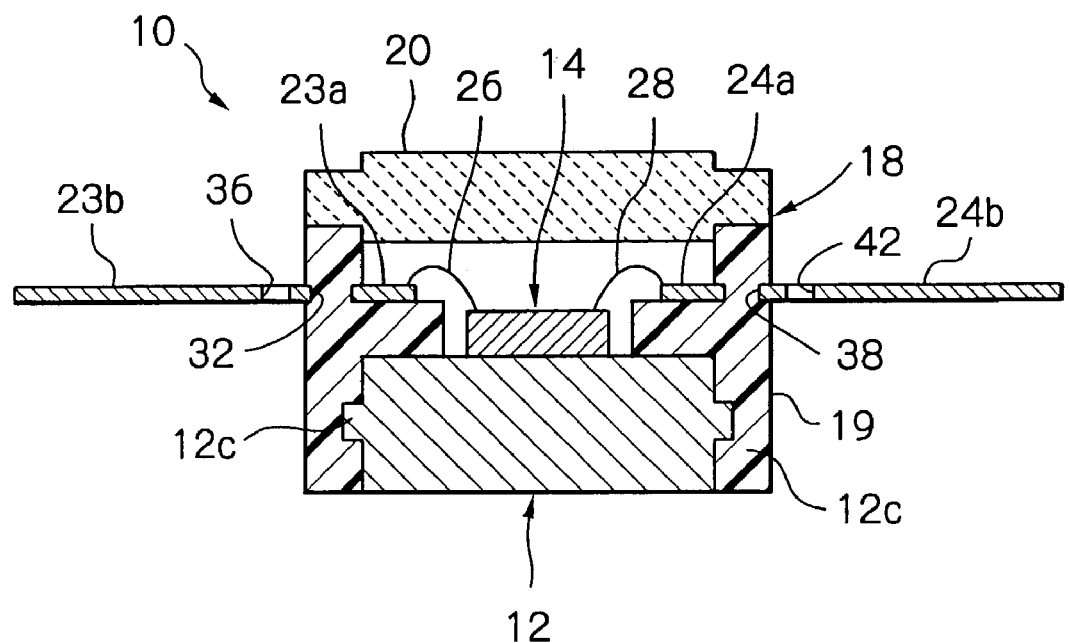
FIG. 14 is a lateral cross-sectional view, similar to FIG. 4, showing a modification of the electronic product.

As already mentioned above, in the first embodiment, the lid member 20 is made of the ceramic material. However, when a high frequency signal is processed in the electronic component 14, it is preferable to modify the electronic product 10, as shown in FIG. 14, corresponding to FIG. 4. Namely, the lid member 20 is made of a suitable metal material, such as, copper, silver or the like. The metal lid member 20 serves as an electromagnetic shield due to an electrical conductivity thereof, whereby it is possible to suppress an emission of high frequency noises from the electronic product 10.

Figure 15:
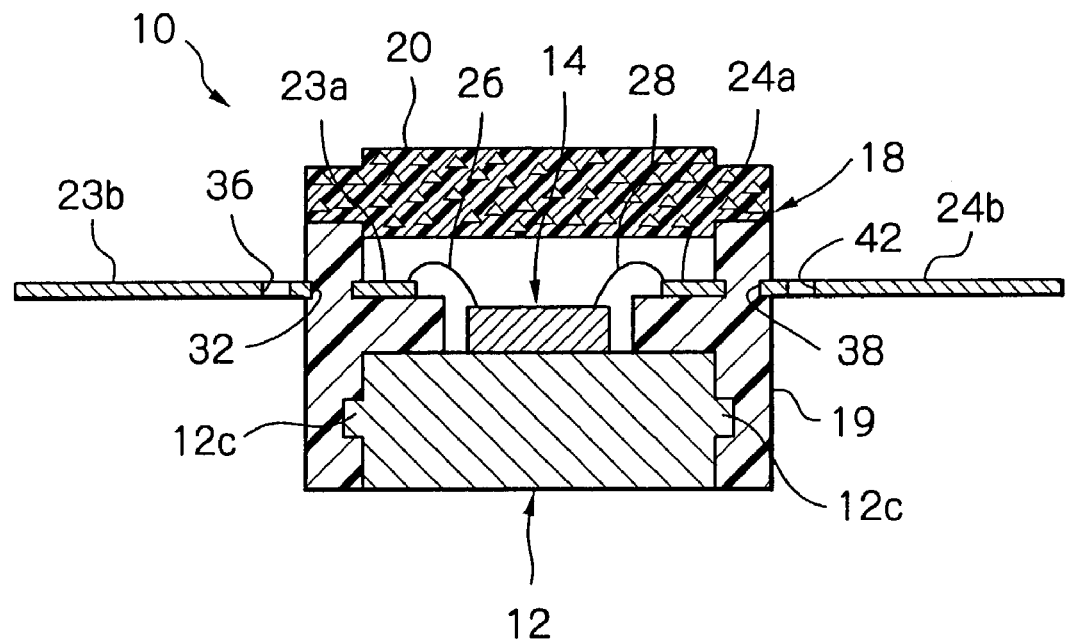
FIG. 15 is a lateral cross-sectional view, similar to FIG. 4, showing another modification of the electronic product.

Further, the electronic product 10 may be modified as shown in FIG. 15. Namely, in this modified embodiment, the lid member 20 is made of a composite material composed of a suitable thermosetting resin, such as epoxy or the like, and suitable filler represented by a plurality of small open-triangles "Δ" in FIG. 15. When a low frequency signal is processed in the electronic component 14, the filler may comprise a suitable non-conductive material, such as wood chips or pieces, ceramic chips or pieces or the like. When a high frequency signal is processed in the electronic component 14, the filler should comprise a suitable conductive material, such as metal chips or pieces, carbon powder or the like. Namely, when the filler comprises the conductive material, the lid member 20 serves as an electromagnetic shield for suppressing the emission of high frequency noises from the electronic product 10.

Figure 16:
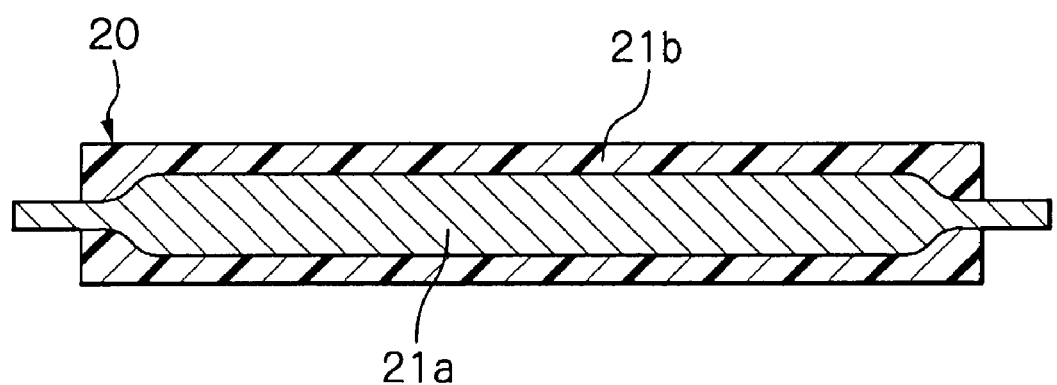
FIG. 16 shows a lateral cross-sectional view showing a modification of a composite lid member shown in FIG. 15.

FIG. 16 shows a modification of the lid member 20, a part of which exhibits an electrical conductivity. In particular, the modified lid member 20 is constituted as a composite lid member comprising a metal sheet element 21a made of a suitable metal material, such as copper, silver or the like, which is enveloped as a core body in a resin plate element 21b made of a suitable material, such as epoxy or the like. This composite lid member 20 also serves as the electromagnetic shield for suppressing the emission of high frequency noises from the electronic product 10.

Figure 17:
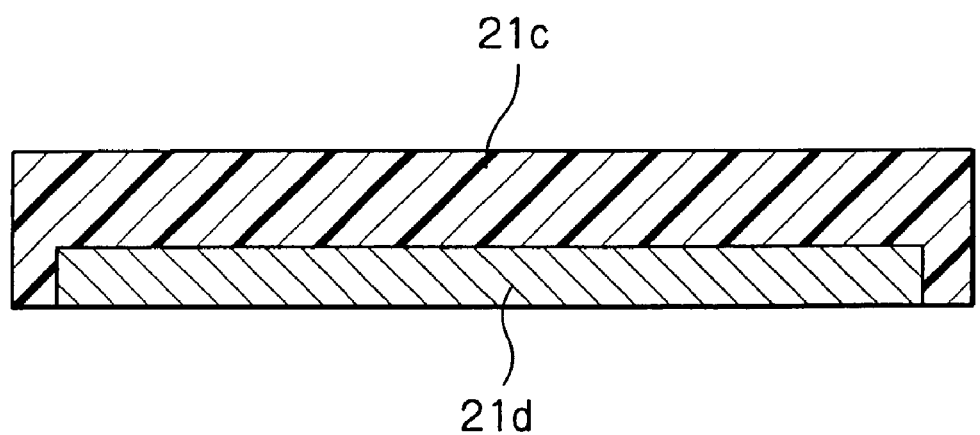
FIG. 17 shows a lateral cross-sectional view showing another modification of the composite lid member shown in FIG. 15.

FIG. 17 shows another modification of the lid member 20, a part of which also exhibits an electrical conductivity. In particular, the modified lid member is constituted as a composite lid member comprising a resin plate element 21c made of a suitable thermosetting resin material, such as epoxy or the like, in which a metal sheet element 21d, made of a suitable metal material, such as copper, silver or the like is embedded in a surface of the resin plate element 21c such that a surface of the metal sheet element 21d is exposed. Preferably, the embedding of the metal sheet element 21d is performed such that the surfaces of the resin plate element 21c and metal sheet element 21d are flush with each other, as shown in FIG. 17. Similar to the modification of FIG. 16, the composite lid member 20 serves as an electromagnetic shield for suppressing the emission of high frequency noises from the electronic product 10.

Figure 18:
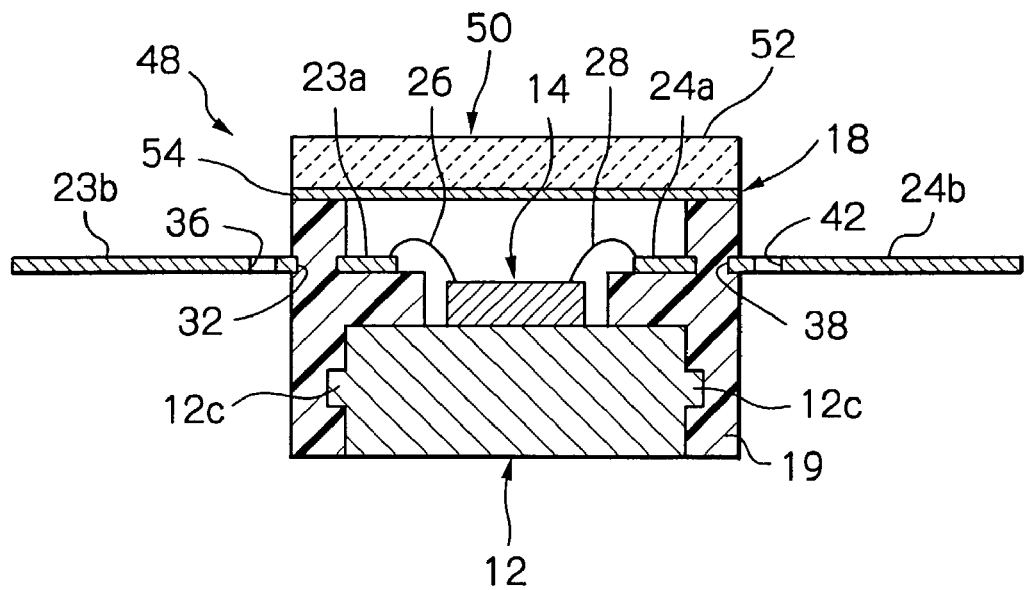
FIG. 18 is a lateral cross-sectional view, similar to FIG. 4, showing a second embodiment of an electronic product according to the present invention.

FIG. 18, similar to FIG. 4, shows a second embodiment of an electronic product according to the present invention. In this drawing, the elements similar to those of FIG. 4, are indicated by the same references.

In the second embodiment, the electronic product, generally indicated by reference 48, is substantially identical to the electronic product 10 except that a lid member 50 is substituted for the lid member 20. The lid member 50 comprises a rectangular ceramic plate element 52 having the same profile as the lid member 20 (FIG. 7A), and an electrically conductive layer 54 applied to a surface of the ceramic plate element 52, and is adhered to the top opening end of the frame member 19 with a suitable adhesive agent.

The electrically conductive layer 54 may be formed by attaching or adhering a suitable metal sheet, made of copper, silver or the like, to the surface of the ceramic plate element 52. Also, it is possible to perform the formation of the conductive layer 54 by a deposit of metal layer based on a sputtering process. Further, the conductive layer 54 may be formed by coating the surface of the ceramic plate element 52 with electrically conductive paste.

Of course, since the conductive layer 54 serves as an electromagnetic shield, the electronic product 48 is suited to the case where a high frequency signal is processed in the electronic component 14.

Figure 19:
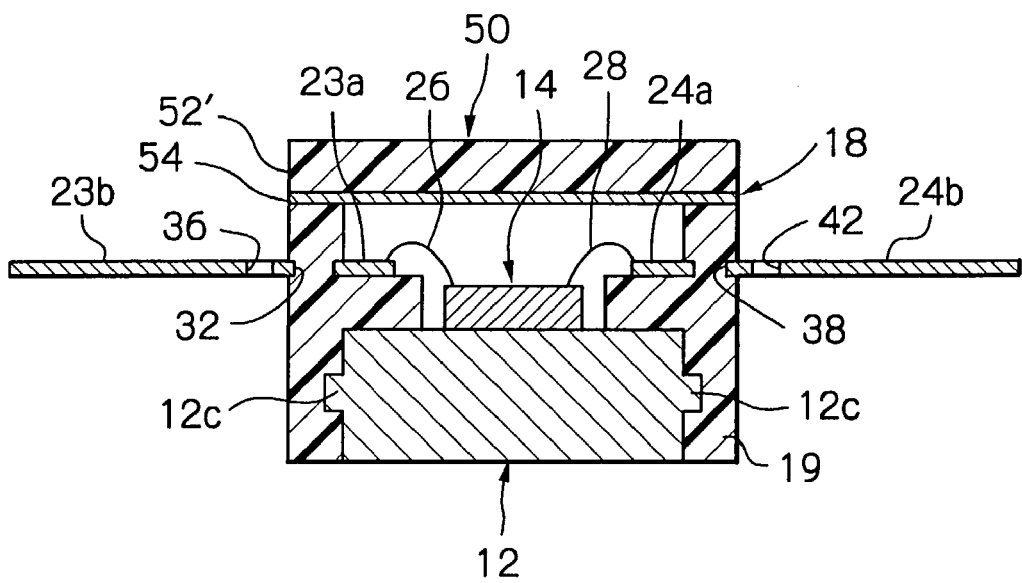
FIG. 19 is a lateral cross-sectional view, similar to FIG. 18, showing a modification of the second embodiment of the electronic product.

The electronic product 10 may be modified as shown in FIG. 19. Namely, in this modified embodiment, a resin plate element 52', made of a suitable thermosetting resin material, is substituted for the ceramic plate element 52 of the lid member 50. Alternatively, the resin plate element 52' may be replaced with a composite plate element which is made of a non-conductive composite material as explained with reference to FIG. 15. Namely, the composite plate element is composed of a suitable thermosetting resin, such as epoxy or the like, and a suitable non-conductive filler, such as wood chips or pieces, ceramic chips or pieces or the like.

In the embodiments shown in FIGS. 18 and 19, it is difficult to select materials for the plate element (52, 52') and the conductive layer 54 such that a coefficient of thermal expansion of the plate element (52, 52') is consistent with that of the conductive layer 54, and thus the lid member 52 may be warped and deformed due to a thermal expansion difference between the plate element (52, 52') and the conductive layer 54. Eventually, the plate element (52, 52') and the conductive layer 54 may be peeled from each other while being to subjected to variations in temperature over a period of long time.

Figure 20:
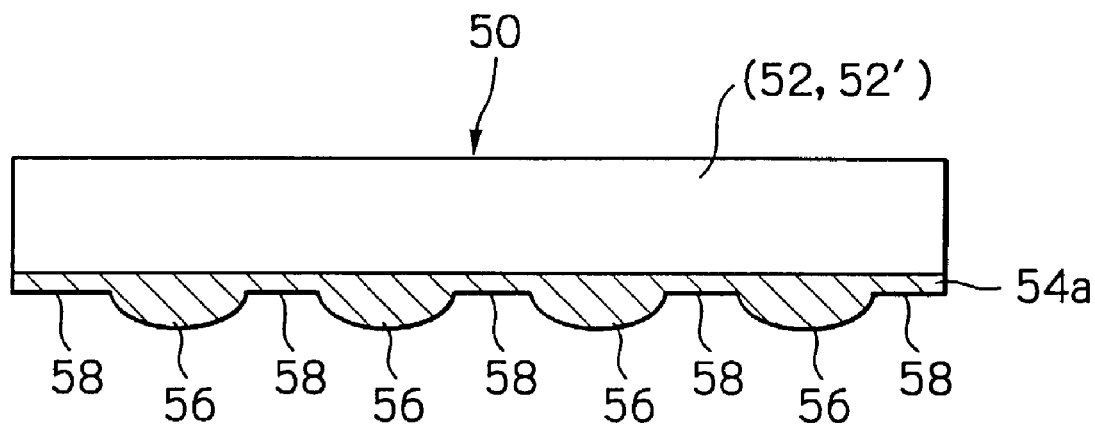
FIG. 20 is a partial lateral cross-sectional view showing a modification of a lid member used in the electronic product in shown in either FIG. 18 or FIG. 19.

To mitigate the thermal expansion difference between the plate element (52, 52') and the conductive layer 54, it is preferable to modify the lid member 50 as shown in FIG. 20. In particular, in this modified embodiment, the lid member 50 is provided with an electrically conductive layer 54a, a thickness of which is regularly varied. Namely, the conductive layer 54a is formed from a plurality of thick portions 56 and a plurality of thin portions 58 which are regularly arranged on the surface of the plate element (52, 52'). When the lid member 50 is subjected to variation in temperature, it is possible to absorb the thermal expansion difference between the plate element (52, 52') and the conductive layer 54 by the regular-arrangement of the thick and thin portions 56 and 58, resulting in mitigation of the thermal expansion difference between the plate element (52, 52') and the conductive layer 54a.

Figure 21:
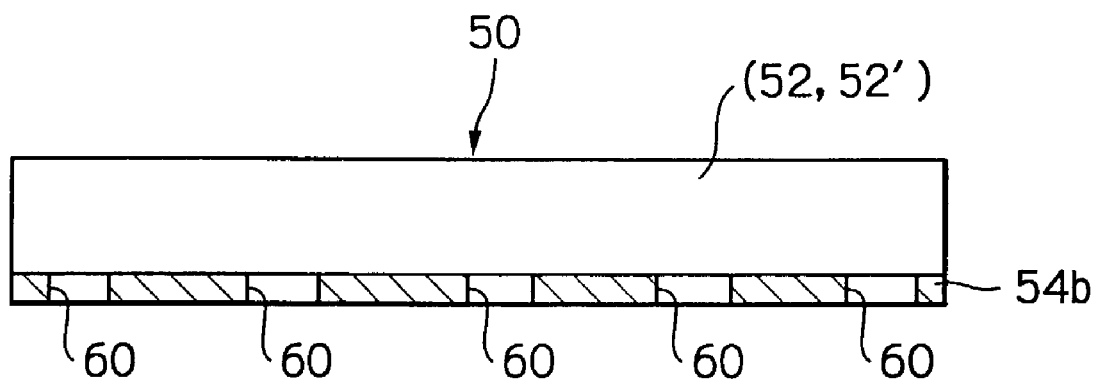
FIG. 21 is a partial lateral cross-sectional view showing another modification of the lid member used in the electronic product in shown in either FIG. 18 or FIG. 19.

FIG. 21 shows another modification of the lid member 50 illustrated in either FIG. 18 or FIG. 19. In this modification, the lid member 50 has an electrically conductive layer 54b which is regularly formed with a plurality of openings 60. When the lid member 50 is subjected to variation in temperature, it is possible to absorb the thermal expansion difference between the plate element (52, 52') and the conductive layer 54b by the regular-arrangement of the openings 60, resulting in mitigation of the thermal expansion difference between the plate element (52, 52') and the conductive layer 54b.

In the aforesaid embodiments in which a whole or a part of the lid member (20, 50) exhibits an electrical conductivity, a parasitic capacitance may be produced due to the fact that the lid member (20, 50), exhibiting the electrical conductivity, is electrically floated. The production of the parasitic capacitance should be prevented, because the parasitic capacitance exerts a bad influence on an operation of the electronic component 14. For example, the production of the parasitic capacitance delays transmission of signals in the electronic component 14.

Figure 22:
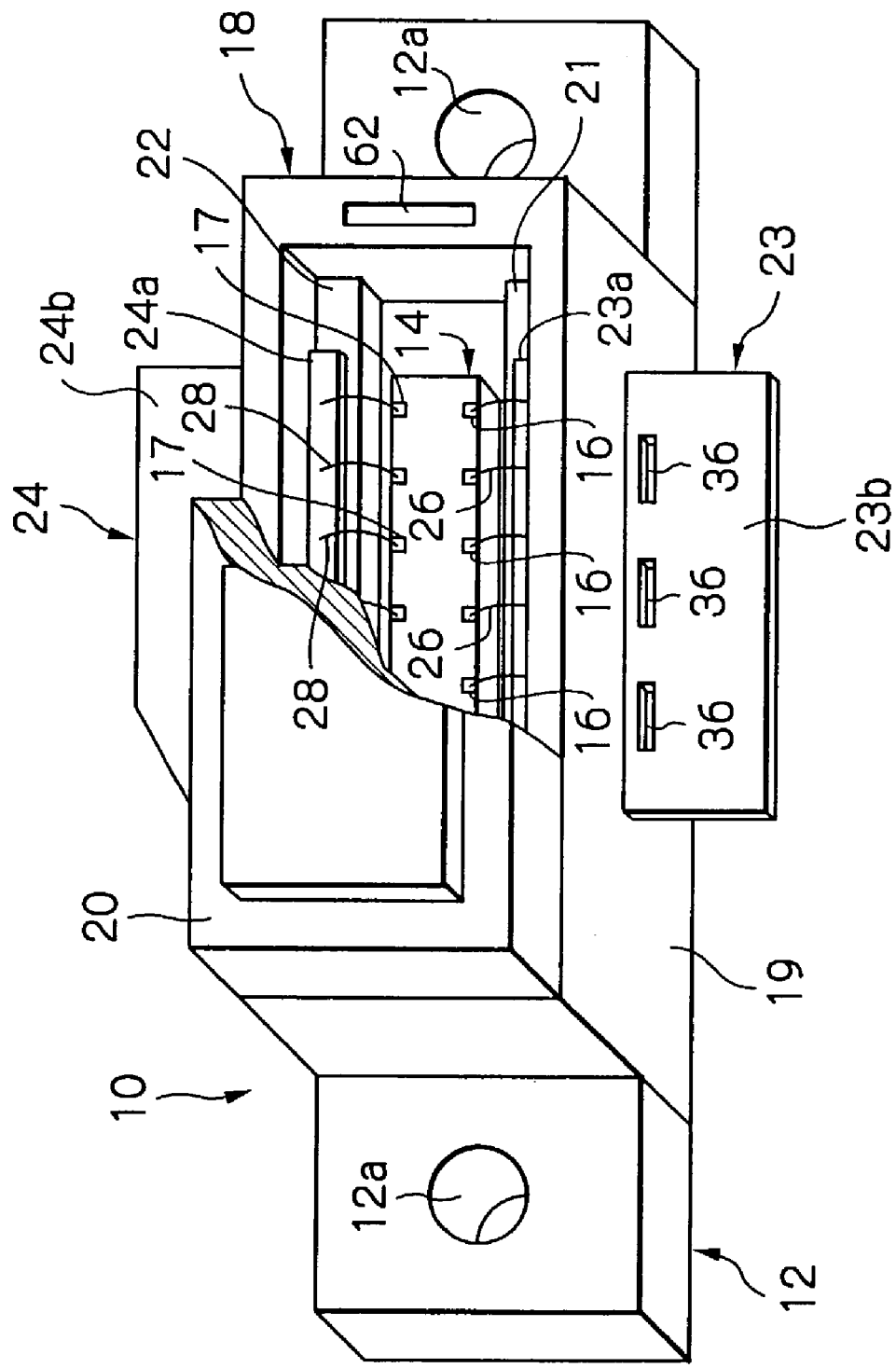
FIG. 22 is a partially-cutaway perspective view, similar to FIG. 1, showing a third embodiment of an electronic product according to the present invention.

FIG. 22, similar to FIG. 1, shows a third embodiment of an electronic product according to the present invention, which is directed to prevention of the production of the aforesaid parasitic capacitance. In this drawing, the elements similar to those of FIG. 1, are indicated by the same references.

In the third embodiment, the rectangular frame member 19 has an electrically conductive element 62 which is embedded in one of the opposing lateral side walls thereof. The conductive element 62 may be formed as a suitable plate-like element made of a suitable metal, such as copper, silver or the like. The conductive element 62 is put in the molding cavity of the metal mold 44 (FIGS. 9 and 10) when the frame member 19 is molded, whereby the embedding of the conductive element 62 is achieved such that a lower end face of the conductive element 62 is in electrical contact with the heat radiating plate 12.

As shown in FIG. 22, an upper end of the conductive element 62 is exposed. Thus, by electrically connecting the lid member (20, 50), exhibiting the electrical conductivity, to the upper end face of the conductive element 62, the lid member (20, 50) is grounded to the heat radiating plate 12, resulting in the prevention of the production of the parasitic capacitance. For example, the electrical connection of the lid member (20, 50) to the upper end face of the conductive element 62 can be established by adhering the lid member (20, 50) to the upper opening end of the frame member 19, using an electrically conductive adhesive agent.

In the third embodiment, although the conductive element 62 is embedded in only one of the opposing lateral side walls thereof, it is possible to embed an electrically conductive element in the other lateral side wall. Also, an electrically conductive element may be embedded in at least one of the opposing longitudinal side walls of the frame member 19 without being in contact with the corresponding lead (23, 24).

Figure 23:
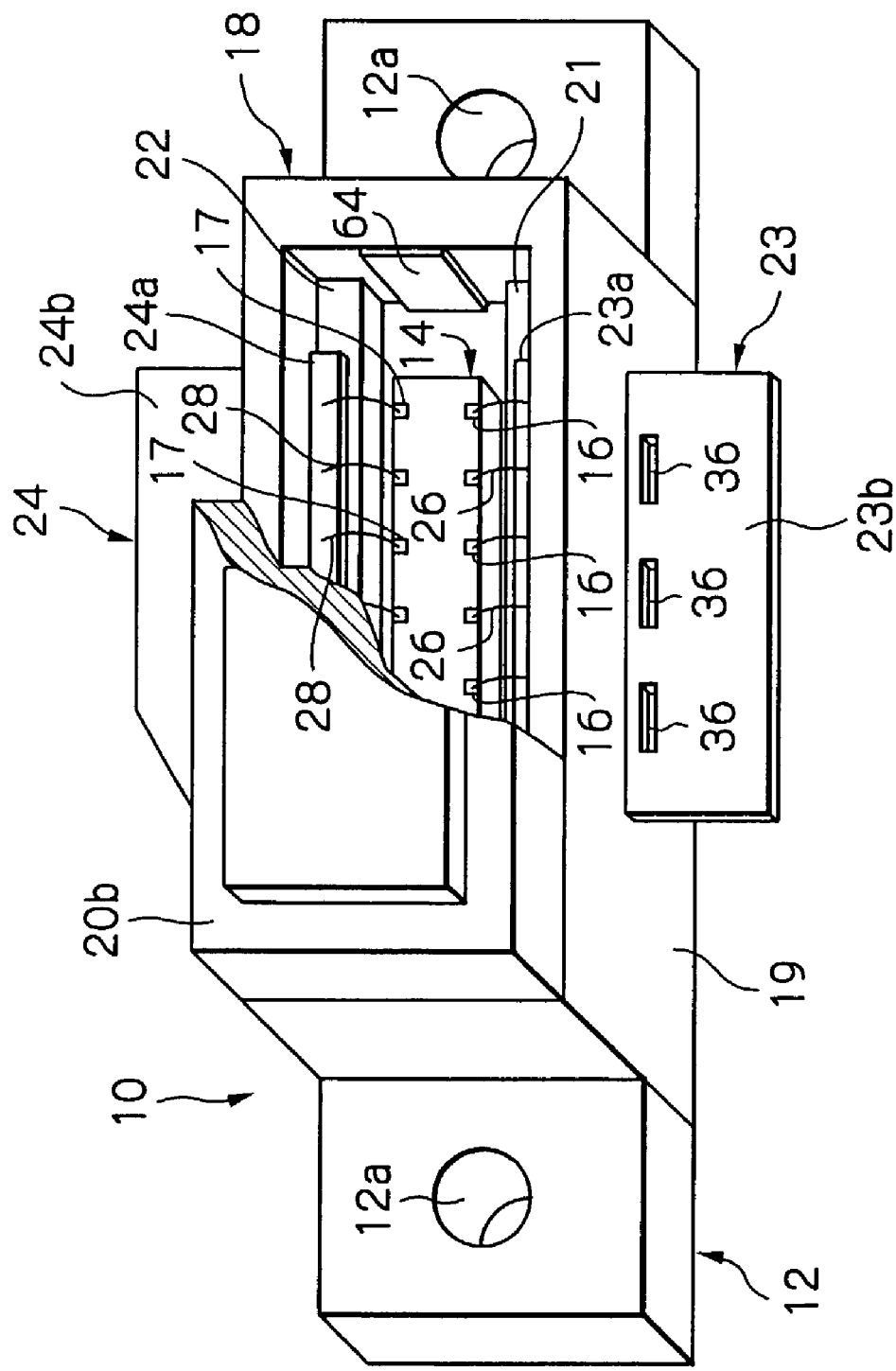
FIG. 23 is a partially-cutaway perspective view, similar to FIG. 1, showing a modification of the third embodiment of the electronic product according to the present invention.

FIG. 23, similar to FIG. 1, shows a modification of the third embodiment shown in FIG. 22. In this drawing, the elements similar to those of FIG. 1, are indicated by the same references.

As shown in FIG. 23, in this modified embodiment, an electrically conductive layer 64 is applied to one inner wall face of the opposing lateral side walls of the frame member 19. The electrically conductive layer 64 may be formed by attaching or adhering a suitable metal sheet, made of copper, silver or the like, to the inner surface of the lateral side wall of the frame member 19 with a suitable adhesive agent. Also, the conductive layer 64 may be formed by coating the inner surface of the lateral side wall of the frame member 19 with electrically conductive paste.

Similar to the third embodiment, the conductive layer 64 is in electrical contact with the heat radiating plate 12, and is electrically connected to the lid member (20, 50), exhibiting electrical conductivity, by adhering the lid member (20, 50) to the upper opening end to the frame member 19 with a suitable electrically conductive adhesive agent. Thus, the lid member (20, 50) is grounded to the heat radiating plate 12, resulting in the prevention of the production of the parasitic capacitance.

In the modified embodiments shown in FIG. 23, it is difficult to select materials for the frame member 19 and the conductive layer 64 so that a coefficient of thermal expansion of the frame member 19 is consistent with that of the conductive layer 64, and thus the conductive layer 64 may be warped and deformed due to a thermal expansion difference between the frame member 19 and the conductive layer 64. Eventually, the conductive layer 64 may be peeled from the lateral side wall of the frame member 19 while being to subjected to variations in temperature over a period of long time.

To mitigate the thermal expansion difference between the frame member 19 and the conductive layer 64, it is preferable to modify the conductive layer 64 as shown in FIG. 25. In particular, the conductive layer 64 is replaced with an electrically conductive layer 64a, a thickness of which is regularly varied. Namely, the conductive layer 64a is formed from a plurality of thick portions 66 and a plurality of thin portions 68 which are regularly arranged on the inner wall face of the lateral side wall of the frame member 19. When the conductive layer 64a is subjected to variation in temperature, it is possible to absorb the thermal expansion difference between the lateral side wall of the frame member 19 and the conductive layer 64a by the regular arrangement of the thick and thin portions 66 and 88, resulting in mitigation of the thermal expansion difference between the lateral side wall of the frame member 19 and the conductive layer 64a.

FIG. 25 shows another modification of the conductive layer 64 illustrated in FIG. 24. In particular, the conductive layer 64 is replaced with an electrically conductive layer 64b which is formed with a plurality of regular openings 70. When the conductive layer 64b is subjected to variation in temperature, it is possible to absorb the thermal expansion difference between the lateral side wall of the frame member 19 and the conductive layer 64b by the regular arrangement of the openings 70, resulting in mitigation of the thermal expansion difference between the lateral side wall of the frame member 19 and the conductive layer 64b.

Finally, it will be understood by those skilled in the art that the foregoing description is of preferred embodiments of the product, and that various changes and modifications may be made to the present invention without departing from the spirit and scope thereof.

What is claimed is:

1. An electronic product comprising:
    a heat radiating plate;
    an electronic component securely mounted on said heat radiating plate;
    an enveloper including a frame member securely associated with said heat radiating plate to encompass said electronic component, and a lid member securely attached to an upper opening end of said frame member, thereby accommodating and sealing said electronic component in said enveloper; and
    at least one electrically conductive element passing and extending through said frame member,
    wherein said frame member is made of a suitable resin material, and said lid member is made of one material selected from the group consisting of a ceramic material, a metal material, and a composite material;
    wherein said frame member is molded from said resin by a molding process, and said at least one electrically conductive element is formed with at least one perforation which is embedded in the molded frame member so as to be mechanically engaged with said molded frame member.

2. An electronic product as set forth in claim 1, wherein said composite material is composed of a suitable resin material, and a suitable filler material.

3. An electronic product as set forth in claim 1, wherein said heat radiating plate is configured so as to be mechanically engaged with the molded frame member.

4. An electronic product as set forth in claim 1, wherein said heat radiating plate is formed with at least one recess which is embedded in the molded frame member, so as to be mechanically engaged with said molded frame member.

5. An electronic product as set forth in claim 1, wherein said heat radiating plate is further formed with at least one projection arranged on a wall face forming said recess, thereby further ensuring the mechanical engagement between said radiating plate and said molded frame member.

6. An electronic product as set forth in claim 1, wherein said at least one electrically conductive element is configured so as to be mechanically engaged with the molded frame member.

7. An electronic product as set forth in claim 1, wherein said at least one electrically conductive element is formed with an alignment of perforations and endmost cutouts which are embedded in said molded frame member so as to be mechanically engaged with the molded frame member.

8. An electronic product as set forth in claim 1, wherein said frame member is molded from said resin by a molding process, and said at least one electrically conductive element is formed with at least one perforation at an outside of the molded frame member to thereby reduce a rigidity of an outer section of said electrically conductive element.

9. An electronic product as set forth in claim 1, wherein, said at least one electrically conductive element includes a first alignment of perforations which are embedded in said molded frame member so as to be mechanically engaged with said molded frame member, and a second alignment of perforations arranged along an outer wall face of the molded frame member to thereby reduce a rigidity of an outer section of said electrically conductive element, the perforations included in said second alignment being alternately arranged with respect to the perforations included in said first alignment.

10. An electronic product as set forth in claim 1, wherein said lid member is formed with two rectangular land portions which are integrally swelled from opposing wall faces thereof, and which are symmetrically arranged with respect to a geometrical neutral plane of said lid member, and each land portion is sized so as to be fitted into the upper opening end of said frame member.

11. An electronic product as set forth in claim 1, wherein said heat radiating plate includes inner and outer portions which are divided and defined by said frame member; the inner portion of said heat radiating plate, which is inside said frame member, is surfaced with silver-plating, and the outer portion of said heat radiating plate, which is outside said frame member, is surfaced with gold-plating; said at least one electrically conductive element includes inner and outer lead sections which are divided and defined by said frame member; and said inner and outer lead sections are surfaced with gold-plating.

12. An electronic product as set forth in claim 1, wherein said at least one electrically conductive element is derived from a lead frame, and said heat radiating plate is prepared as a part which is independent from said lead frame.

13. An electronic product as set forth in claim 1, wherein said electronic component comprises a high power transistor, and said at least one electrically conductive element is defined as a first lead, said electronic product further comprising a second lead passing and extending through said frame member, said respective first and second leads being electrically connected to said high power transistor so as to form input and output terminals of said high power transistor, said heat radiating plate being electrically connected to form a grounded terminal of said high power transistor.

14. An electronic product comprising:
a heat radiating plate;
an electronic component securely mounted on said heat radiating plate;
an enveloper including a frame member securely associated with said heat radiating plate to encompass said electronic component, and a lid member securely attached to an upper opening end of said frame member, thereby accommodating and sealing said electronic component in said enveloper; and
at least one electrically conductive element passing and extending through said frame member,
wherein said frame member is made of a suitable resin material, and at least a part of said lid member exhibits an electrical conductivity; and said frame member is molded from said resin by a molding process, and said at least one electrically conductive element is formed with at least one perforation which is embedded in the molded frame member so as to be mechanically engaged with said molded frame member.

15. An electronic product as set forth in claim 14, wherein said lid member is made of a suitable metal material.

16. An electronic product as set forth in claim 14, wherein said lid member is made of an electrically conductive resin material.

17. An electronic product as set forth in claim 14, wherein said lid member is constituted as a composite lid member composed of a metal sheet element, and a resin plate element.

18. An electronic product as set forth in claim 14, wherein said lid member is constituted as a composite lid member composed of a non-conductive plate element, and an electronic conductive layer formed on a surface of said non-conductive plate element.

19. An electronic product as set forth in claim 18, wherein said electronic conductive layer comprises a suitable metal sheet securely adhered to the surface of said non-conductive plate element.

20. An electronic product as set forth in claim 18, wherein said electronic conductive layer is formed by coating the surface of said non-conductive plate element with a suitable electrically conductive paste material.

21. An electronic product as set forth in claim 18, wherein said electronic conductive layer is configured such that a thermal expansion difference between said non-conductive plate element and said electronic conductive layer is mitigated.

22. An electronic product as set forth in claim 18, wherein said electronic conductive layer is formed from a plurality of thick portions and a plurality of thin portions which are regularly arranged on the surface of the plate element such that a thermal expansion difference between said non-conductive plate element and said electronic conductive layer is mitigated.

23. An electronic product as set forth in claim 18, wherein said electronic conductive layer is formed with a plurality of openings such that a thermal expansion difference between said non-conductive plate element and said electronic conductive layer is mitigated.

24. An electronic product as set forth in claim 14, wherein said frame member is provided with an electrically conductive element through which said lid member is electrically connected to said heat radiating plate.

25. An electronic product as set forth in claim 24, wherein said electrically conductive element is embedded in the molded frame member.

26. An electronic product as set forth in claim 24, wherein said electrically conductive element is constituted as an electronic conductive layer formed on a wall face of said frame member.

27. An electronic product as set forth in claim 26, wherein said electronic conductive layer comprises a suitable metal sheet securely adhered to the wall face of said frame member.

28. An electronic product as set forth in claim 26, wherein said electronic conductive layer is formed by coating the wall face of said frame member with a suitable electrically conductive paste material.

29. An electronic product as set forth in claim 26, wherein said electronic conductive layer is configured such that a thermal expansion difference between said frame member and said electronic conductive layer is mitigated.

30. An electronic product as set forth in claim 26, wherein said electronic conductive layer is formed from a plurality of thick portions and a plurality of thin portions which are regularly arranged on the wall face of said frame member such that a thermal expansion difference between said frame member and said electronic conductive layer is mitigated.

31. An electronic product as set forth in claim 26, wherein said electronic conductive layer is formed with a plurality of openings (70) such that a thermal expansion difference between said frame member and said electronic conductive layer is mitigated.

32. An electronic product as set forth in claim 14, wherein said heat radiating plate is configured so as to be mechanically engaged with the molded frame member.

33. An electronic product as set forth in claim 14, wherein said heat radiating plate is formed with at least one recess which is embedded in the molded frame member, so as to be mechanically engaged with said molded frame member.

34. An electronic product as set forth in claim 14, wherein said heat radiating plate is formed with at least one projection arranged on a wall face forming said recess, thereby further ensuring the mechanical engagement between said radiating plate and said molded frame member.

35. An electronic product as set forth in claim 14, wherein said at least one electrically conductive element is configured so as to be mechanically engaged with the molded frame member.

36. An electronic product as set forth in claim 14, wherein said at least one electrically conductive element is formed with an alignment of perforations and endmost cutouts which are embedded in said molded frame member so as to be mechanically engaged with the molded frame member.

37. An electronic product as set forth in claim 14, wherein said at least one electrically conductive element is formed with at least one perforation at an outside of the molded frame member to thereby reduce a rigidity of an outer section of said electrically conductive element.

38. An electronic product as set forth in claim 14, wherein said at least one electrically conductive element includes a first alignment of perforations which are embedded in said molded frame member so as to be mechanically engaged with said molded frame member, and a second alignment of perforations arranged along an outer wall face of the molded frame member to thereby reduce a rigidity of an outer section of said electrically conductive element, the perforations included in said second alignment being alternately arranged with respect to the perforations included in said first alignment.

39. An electronic product as set forth in claim 14, wherein said lid member is formed with two rectangular land portions which are integrally swelled from opposing wall faces thereof, and which are symmetrically arranged with respect to a geometrical neutral plane of said lid member, and each land portion is sized so as to be fitted into the upper opening end of said frame member.

40. An electronic product as set forth in claim 14, wherein said heat radiating plate includes inner and outer portions which are divided and defined by said frame member; the inner portion of said heat radiating plate, which is inside said frame member, is surfaced with silver-plating; the outer portion of said heat radiating plate, which is outside said frame member, is surfaced with gold-plating; said at least one electrically conductive element includes inner and outer lead sections which are divided and defined by said frame member; and said inner and outer lead sections are surfaced with gold-plating.

41. An electronic product as set forth in claim 14, wherein said at least one electrically conductive element is derived from a lead frame, and said heat radiating plate is prepared as a part which is independent from said lead frame.

42. An electronic product as set forth in claim 14, wherein said electronic component comprises a high power transistor, and said at least one electrically conductive element is defined as a first lead, said electronic product further comprising a second lead passing and extending through said frame member, said respective first and second leads being electrically connected to said high power transistor so as to form input and output terminals of said high power transistor, said heat radiating plate being electrically connected to form a grounded terminal of said high power transistor.

* * * * *